(12) United States Patent
Bibl et al.

(10) Patent No.: US 9,136,161 B2
(45) Date of Patent: Sep. 15, 2015

(54) MICRO PICK UP ARRAY WITH COMPLIANT CONTACT

(71) Applicant: LuxVue Technology Corporation, Santa Clara, CA (US)

(72) Inventors: Andreas Bibl, Los Altos, CA (US); Dariusz Golda, Redwood City, CA (US)

(73) Assignee: LuxVue Technology Corporation, Santa Clara, CA (US)

( * ) Notice: Subject to any disclaimer, the term of this patent is extended or adjusted under 35 U.S.C. 154(b) by 200 days.

(21) Appl. No.: 13/909,892

(22) Filed: Jun. 4, 2013

(65) Prior Publication Data

US 2014/0355168 A1    Dec. 4, 2014

(51) Int. Cl.
*H01L 21/683* (2006.01)
*H01L 23/00* (2006.01)
*H01L 21/768* (2006.01)
*B81C 99/00* (2010.01)

(52) U.S. Cl.
CPC ........ *H01L 21/76802* (2013.01); *B81C 99/002* (2013.01); *H01L 21/6835* (2013.01); *H01L 21/76877* (2013.01); *H01L 21/76898* (2013.01); *H01L 24/75* (2013.01); *H01L 2221/68322* (2013.01); *H01L 2221/68354* (2013.01); *H01L 2221/68368* (2013.01); *H01L 2221/68381* (2013.01); *H01L 2924/1461* (2013.01)

(58) Field of Classification Search
CPC ..................................................... B81C 99/002
USPC .......................................................... 361/234
See application file for complete search history.

(56) References Cited

U.S. PATENT DOCUMENTS

| 5,592,358 | A  | 1/1997  | Shamouilian et al. |
| 5,839,187 | A  | 11/1998 | Sato et al. |
| 5,851,664 | A  | 12/1998 | Bennett et al. |
| 5,888,847 | A  | 3/1999  | Rostoker et al. |
| 5,903,428 | A  | 5/1999  | Grimard et al. |
| 5,996,218 | A  | 12/1999 | Shamouilian et al. |
| 6,071,795 | A  | 6/2000  | Cheung et al. |
| 6,335,263 | B1 | 1/2002  | Cheung et al. |
| 6,403,985 | B1 | 6/2002  | Fan et al. |
| 6,420,242 | B1 | 7/2002  | Cheung et al. |

(Continued)

FOREIGN PATENT DOCUMENTS

| JP | 07-060675 A  | 3/1995 |
| JP | 11-142878 A  | 5/1999 |

(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.

(Continued)

*Primary Examiner* — Thienvu Tran
*Assistant Examiner* — Lucy Thomas
(74) *Attorney, Agent, or Firm* — Blakely, Sokoloff, Taylor & Zafman LLP

(57) ABSTRACT

Micro pick up arrays for transferring micro devices from a carrier substrate are disclosed. In an embodiment, a micro pick up array includes a compliant contact for delivering an operating voltage from a voltage source to an array of electrostatic transfer heads. In an embodiment, the compliant contact is moveable relative to a base substrate of the micro pick up array.

13 Claims, 19 Drawing Sheets

(56) References Cited

U.S. PATENT DOCUMENTS

| | | |
|---|---|---|
| 6,521,511 B1 | 2/2003 | Inoue et al. |
| 6,558,109 B2 | 5/2003 | Gibbel |
| 6,613,610 B2 | 9/2003 | Iwafuchi et al. |
| 6,629,553 B2 | 10/2003 | Odashima et al. |
| 6,670,038 B2 | 12/2003 | Sun et al. |
| 6,786,390 B2 | 9/2004 | Yang et al. |
| 6,878,607 B2 | 4/2005 | Inoue et al. |
| 7,033,842 B2 | 4/2006 | Haji et al. |
| 7,148,127 B2 | 12/2006 | Oohata et al. |
| 7,208,337 B2 | 4/2007 | Eisert et al. |
| 7,353,596 B2 | 4/2008 | Shida et al. |
| 7,358,158 B2 | 4/2008 | Aihara et al. |
| 7,585,703 B2 | 9/2009 | Matsumura et al. |
| 7,723,764 B2 | 5/2010 | Oohata et al. |
| 7,795,629 B2 | 9/2010 | Watanabe et al. |
| 7,797,820 B2 | 9/2010 | Shida et al. |
| 7,838,410 B2 | 11/2010 | Hirao et al. |
| 7,880,184 B2 | 2/2011 | Iwafuchi et al. |
| 7,884,543 B2 | 2/2011 | Doi |
| 7,888,690 B2 | 2/2011 | Iwafuchi et al. |
| 7,906,787 B2 | 3/2011 | Kang |
| 7,910,945 B2 | 3/2011 | Donofrio et al. |
| 7,927,976 B2 | 4/2011 | Menard |
| 7,928,465 B2 | 4/2011 | Lee et al. |
| 7,972,875 B2 | 7/2011 | Rogers et al. |
| 7,989,266 B2 | 8/2011 | Borthakur et al. |
| 7,999,454 B2 | 8/2011 | Winters et al. |
| 8,023,248 B2 | 9/2011 | Yonekura et al. |
| 8,333,860 B1 | 12/2012 | Bibl et al. |
| 8,349,116 B1 | 1/2013 | Bibl et al. |
| 8,383,506 B1 | 2/2013 | Golda et al. |
| 8,415,767 B1 | 4/2013 | Golda et al. |
| 8,415,771 B1 | 4/2013 | Golda et al. |
| 8,573,469 B2 | 11/2013 | Hu et al. |
| 8,809,875 B2 | 8/2014 | Bibl et al. |
| 2001/0029088 A1 | 10/2001 | Odajima et al. |
| 2002/0076848 A1 | 6/2002 | Spooner et al. |
| 2003/0010975 A1 | 1/2003 | Gibb et al. |
| 2003/0177633 A1 | 9/2003 | Haji et al. |
| 2004/0232439 A1 | 11/2004 | Gibb et al. |
| 2005/0210988 A1* | 9/2005 | Amano et al. ............ 73/704 |
| 2005/0232728 A1 | 10/2005 | Rice et al. |
| 2006/0065905 A1 | 3/2006 | Eisert et al. |
| 2006/0157721 A1 | 7/2006 | Tran et al. |
| 2006/0160276 A1 | 7/2006 | Brown et al. |
| 2006/0214299 A1 | 9/2006 | Fairchild et al. |
| 2007/0048902 A1 | 3/2007 | Hiatt et al. |
| 2007/0166851 A1 | 7/2007 | Tran et al. |
| 2007/0194330 A1 | 8/2007 | Ibbetson et al. |
| 2008/0048520 A1* | 2/2008 | Gulvin et al. ............ 310/309 |
| 2008/0163481 A1 | 7/2008 | Shida et al. |
| 2008/0194054 A1 | 8/2008 | Lin et al. |
| 2008/0196237 A1 | 8/2008 | Shinya et al. |
| 2008/0283190 A1 | 11/2008 | Papworth et al. |
| 2008/0303038 A1 | 12/2008 | Grotsch et al. |
| 2009/0068774 A1 | 3/2009 | Slater et al. |
| 2009/0146303 A1 | 6/2009 | Kwon |
| 2009/0303713 A1 | 12/2009 | Chang et al. |
| 2009/0314991 A1 | 12/2009 | Cho et al. |
| 2010/0105172 A1 | 4/2010 | Li et al. |
| 2010/0188794 A1 | 7/2010 | Park et al. |
| 2010/0203659 A1 | 8/2010 | Akaike et al. |
| 2010/0203661 A1 | 8/2010 | Hodota |
| 2010/0248484 A1 | 9/2010 | Bower et al. |
| 2010/0276726 A1 | 11/2010 | Cho et al. |
| 2011/0003410 A1 | 1/2011 | Tsay et al. |
| 2011/0049540 A1 | 3/2011 | Wang et al. |
| 2011/0151602 A1 | 6/2011 | Speier |
| 2011/0159615 A1 | 6/2011 | Lai |
| 2011/0210357 A1 | 9/2011 | Kaiser et al. |
| 2012/0027557 A1 | 2/2012 | Ashdown et al. |
| 2012/0064642 A1 | 3/2012 | Huang et al. |
| 2012/0134065 A1 | 5/2012 | Furuya et al. |
| 2013/0285086 A1 | 10/2013 | Hu et al. |
| 2014/0084482 A1 | 3/2014 | Hu et al. |
| 2014/0169924 A1 | 6/2014 | Golda et al. |
| 2014/0169927 A1 | 6/2014 | Golda et al. |
| 2014/0241844 A1 | 8/2014 | Golda et al. |

FOREIGN PATENT DOCUMENTS

| | | |
|---|---|---|
| JP | 2001-298072 A | 10/2001 |
| JP | 2001-353682 A | 12/2001 |
| JP | 2002-134822 A | 5/2002 |
| JP | 2002-164695 A | 6/2002 |
| JP | 2002-176291 A | 6/2002 |
| JP | 2002-240943 A | 8/2002 |
| JP | 2004-095944 A | 3/2004 |
| JP | 2008-200821 A | 9/2008 |
| JP | 2010-056458 A | 3/2010 |
| JP | 2010-186829 A | 8/2010 |
| KR | 10-0610632 B1 | 8/2006 |
| KR | 10-2007-0093091 A | 9/2007 |
| KR | 10-0973928 B1 | 8/2010 |
| KR | 10-1001454 B1 | 12/2010 |
| KR | 10-2007-0006885 A | 1/2011 |
| KR | 10-2011-0084888 A | 7/2011 |
| WO | WO 2005-099310 A2 | 10/2005 |
| WO | WO 2011/123285 | 10/2011 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. Of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Proceedings of CARTS Europe, Barcelona, Spain, 2007, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low-Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Performance Grip and Release" ElectroGrip, Principles1 rev3 May 2006, 2 pgs, accessed at www.electrogrip.com.

Steigerwald, Daniel, et al., "III-V Nitride Semiconductors for High-Performance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

PCT International Search Report and Written Opinion for International Application No. PCT/US2014/039300, mailed Sep. 22, 2014, 14 pages.

* cited by examiner

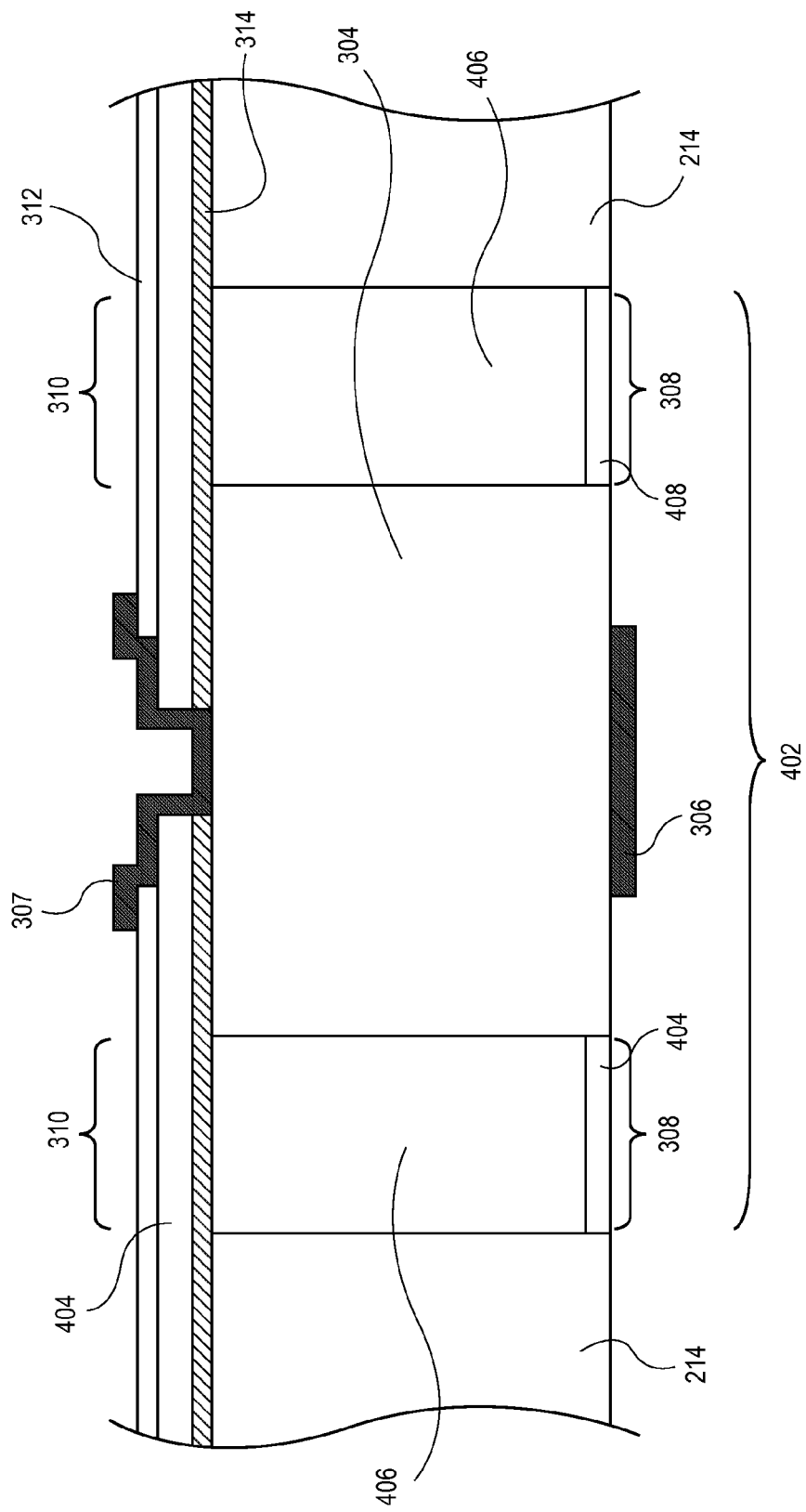

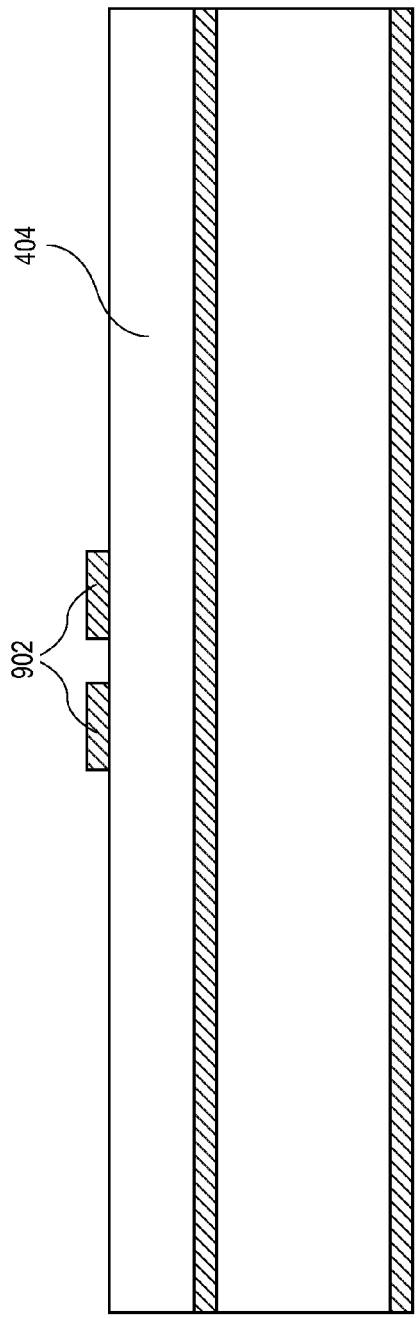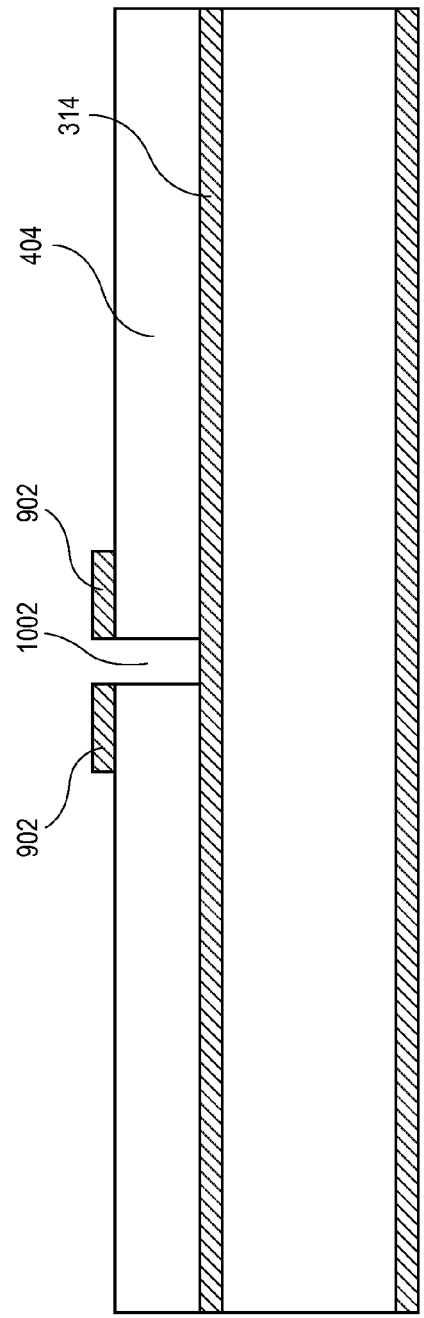

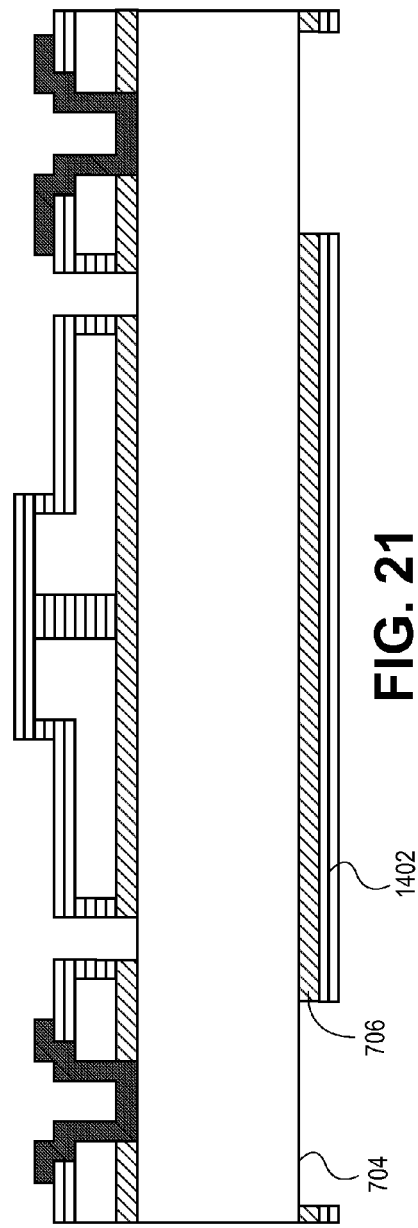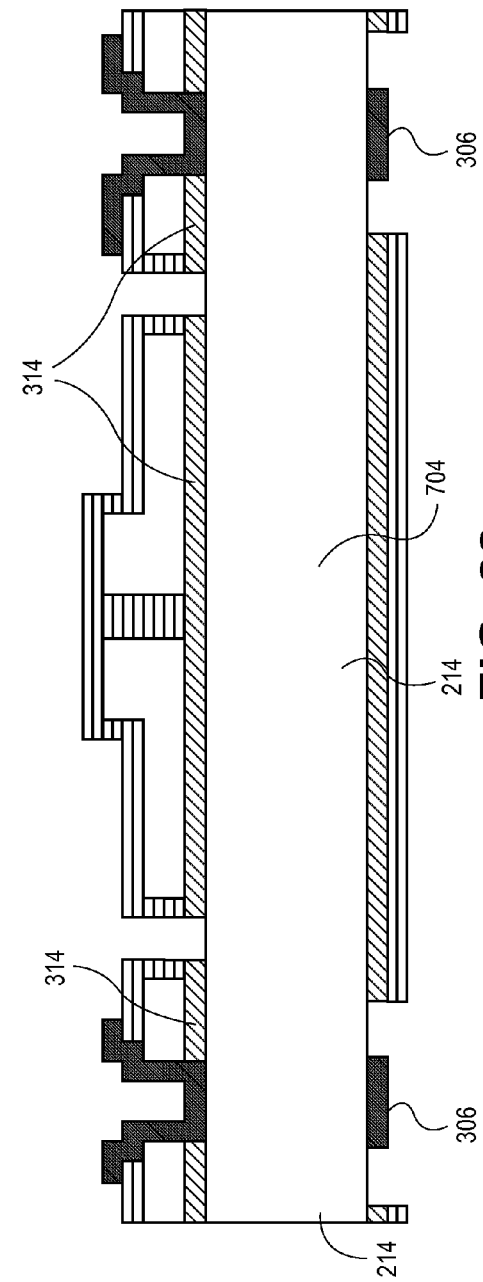

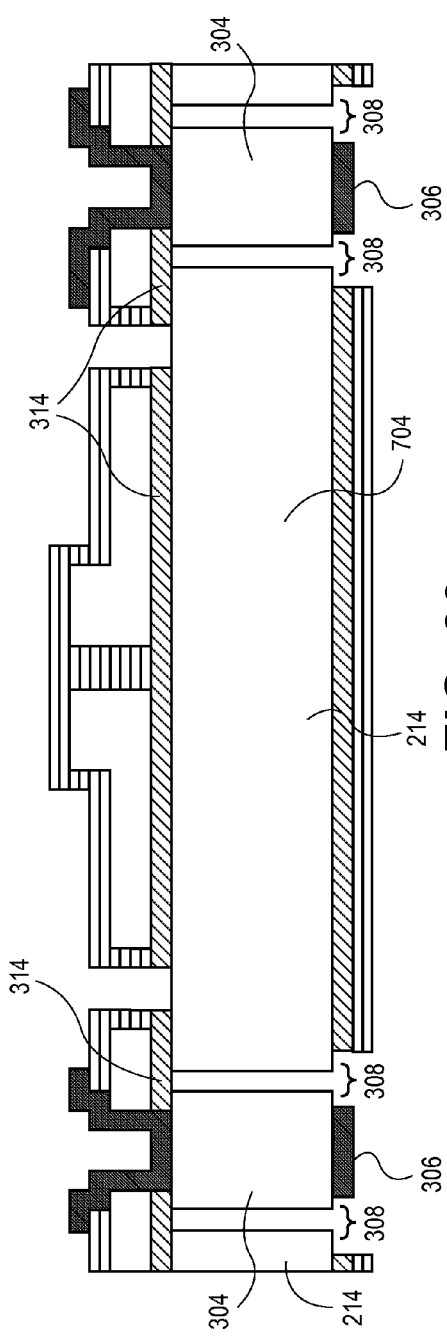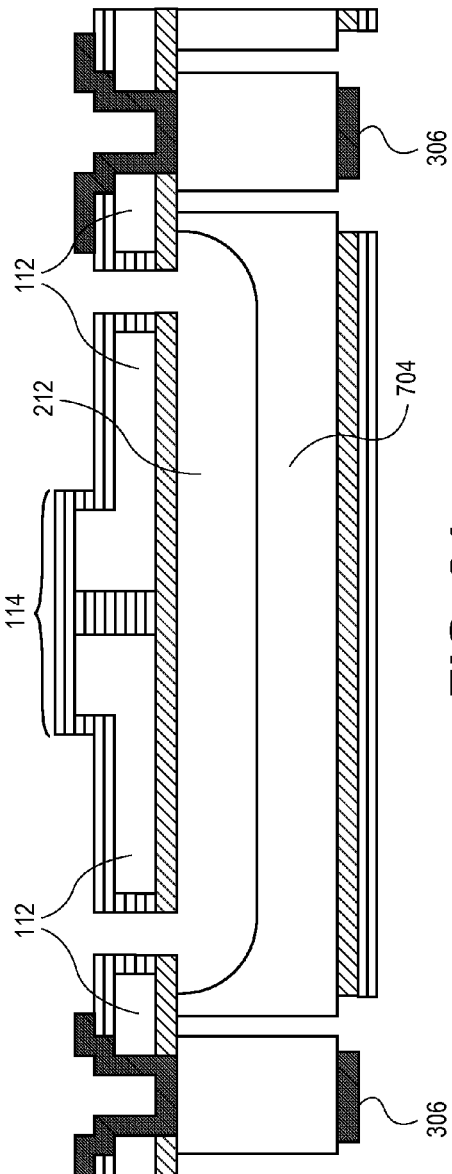

MICRO PICK UP ARRAY WITH COMPLIANT CONTACT

BACKGROUND

1. Field

The present invention relates to micro devices. More particularly embodiments of the present invention relate to micro pick up arrays having compliant contacts.

2. Background Information

Integration and packaging issues are one of the main obstacles for the commercialization of micro devices such as radio frequency (RF) microelectromechanical systems (MEMS) microswitches, light-emitting diode (LED) display systems, and MEMS or quartz-based oscillators.

Traditional technologies for transferring devices include, e.g., "transfer printing", which involves using a transfer wafer to pick up an array of devices from a donor wafer. The array of devices are then bonded to a receiving wafer before removing the transfer wafer. Some transfer printing process variations have been developed to selectively bond and de-bond a device during the transfer process. In both traditional and variations of the transfer printing technologies, the transfer wafer is de-bonded from a device after bonding the device to the receiving wafer. In addition, the entire transfer wafer with the array of devices is involved in the transfer process.

More recently it has been proposed to transfer a semiconductor die from a host substrate to a target substrate using elastomeric stamps in which a stamp surface adheres to a semiconductor die surface via van der Waals forces.

SUMMARY OF THE INVENTION

Micro pick up arrays for transferring micro devices from a carrier substrate are disclosed. In an embodiment, a micro pick up array includes a base substrate having a via, a flexible membrane over the via, and a plug supported by the flexible membrane and moveable relative to the base substrate within the via. The flexible membrane may include a silicon layer and be deflectable such that the plug is moveable by not more than 5 μm along an axis orthogonal to the flexible membrane, relative to the base substrate. A gap may separate the plug from the base substrate. In an embodiment, a breakdown voltage of the gap may be greater than 100 volts at ambient pressure. For example, the gap may separate the plug from the base substrate by more than 10 μm to achieve the breakdown voltage.

In an embodiment, an array of electrostatic transfer heads may be electrically coupled with the plug. The electrostatic transfer heads may be deflectable into a cavity in the base substrate. Each electrostatic transfer head may include a mesa structure with an electrode surface covered by a dielectric layer. Each electrostatic transfer head may also include a second electrode surface covered by the dielectric layer adjacent the electrode surface. An electrode interconnect may electrically couple the electrode surface with the plug. Likewise, a second electrode interconnect may electrically couple the second electrode surface with a second plug. For example, the electrode interconnect may couple with a topside contact on the plug. The topside contact may contact the plug over a contact area that is coplanar with a topside plug area and is less than two-thirds of the topside plug area. A contact pad may be on the plug opposite the topside contact and may be electrically coupled with the topside contact through the plug. An electrical resistance across the plug between the contact pad and topside contact may be in a range between 1 and 100 kiloohms.

In an embodiment, a method of forming a micro pick up array includes etching a top silicon layer of a silicon-on-insulator (SOI) stack to form an array of electrodes and etching through a bulk silicon substrate of the SOI stack to a buried oxide layer of the SOI stack to form a gap separating a plug and a base substrate of the bulk silicon substrate. The plug may be moveable relative to the base substrate. The base substrate may also be etched to form one or more cavities directly underneath the array of electrodes such that one or more electrodes is deflectable into the one or more cavities. The method of forming the micro pick up array may also include etching the top silicon layer to form an electrode interconnect, forming a dielectric layer over the array of electrodes, and forming a topside contact on the bulk silicon substrate. Forming the dielectric layer may include thermal oxidation of the array of electrodes. Alternatively, forming the dielectric layer may include blanket depositing the dielectric layer using atomic layer deposition or depositing the dielectric layer using chemical vapor deposition. The method of forming the micro pick up array may also include etching through the dielectric layer, the electrode interconnect, and the buried oxide layer to expose the plug of the bulk silicon substrate. The topside contact may be formed on the exposed area of the plug. The topside contact may be electrically coupled with the array of electrodes through the electrode interconnect. The method of forming the micro pick up array may also include etching through a backside oxide layer of the SOI stack to expose the plug of the bulk silicon substrate and forming a contact pad on the plug of the bulk silicon substrate opposite the topside contact. The contact pad may be electrically coupled with the topside contact through the plug.

In an embodiment, a system includes a transfer head assembly and a micro pick up array. The transfer head assembly may include one or more operating voltage contacts and a clamping voltage contact. The micro pick up array may include a base substrate, one or more compliant contacts formed through the base substrate, and an array of electrostatic transfer heads on a frontside of the micro pick up array electrically coupled with the one or more compliant contact. The one or more operating voltage contacts may be alignable with the one or more compliant contacts and the clamping voltage contact may be alignable with a backside of the micro pick up array opposite the array of electrostatic transfer heads. Accordingly, when a clamping voltage is applied to the clamping voltage contact the micro pick up array is retained against the transfer head assembly and the plug moves relative to the base substrate.

In an embodiment, the micro pick up array may also include a via in the base substrate, a flexible membrane over the via, and a plug supported within the via by the flexible membrane. A gap may separate the plug from the base substrate and the plug may be movable relative to the base substrate. The array of electrostatic transfer heads may be electrically coupled with the plug. Furthermore, each electrostatic transfer head may include a mesa structure having an electrode surface, and a dielectric layer covering the electrode surface.

BRIEF DESCRIPTION OF THE DRAWINGS

FIG. 4B is a cross-sectional side view illustration taken along a portion of line B-B or C-C of FIG. 2B illustrating a compliant contact with a dielectric-filled gap in accordance with an embodiment of the invention.

FIGS. 7-24 illustrate a method of forming a micro pick up array having an array of electrostatic transfer heads electrically coupled with a compliant contact in accordance with an embodiment of the invention.

DETAILED DESCRIPTION OF THE INVENTION

Figure 1:
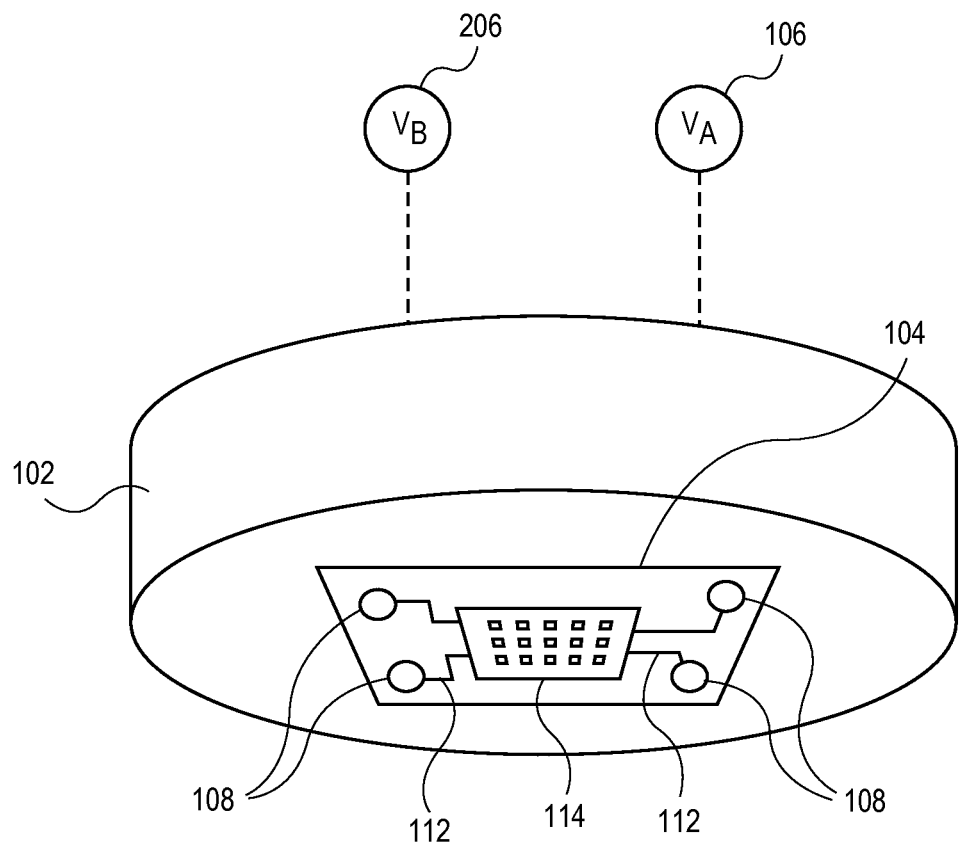
FIG. 1 is a perspective view illustration of a transfer head assembly holding a micro pick up array with a compliant contact in accordance with an embodiment of the invention.

Embodiments of the present invention describe apparatuses and methods for transferring a micro device or an array of micro devices. For example, the micro device or array of micro devices may be any of the micro LED device or micro chip structures illustrated and described in related U.S. patent application Ser. Nos. 13/372,222, 13/436,260, 13/458,932, and 13/711,554. While some embodiments of the present invention are described with specific regard to micro LED devices, the embodiments of the invention are not so limited and certain embodiments may also be applicable to other micro LED devices and micro devices such as diodes, transistors, integrated circuit (IC) chips, and MEMS.

In various embodiments, description is made with reference to the figures. However, certain embodiments may be practiced without one or more of these specific details, or in combination with other known methods and configurations. In the following description, numerous specific details are set forth, such as specific configurations, dimensions, and processes, in order to provide a thorough understanding of the present invention. In other instances, well-known processes and manufacturing techniques have not been described in particular detail in order to not unnecessarily obscure the present invention. Reference throughout this specification to "one embodiment," "an embodiment", or the like, means that a particular feature, structure, configuration, or characteristic described in connection with the embodiment is included in at least one embodiment of the invention. Thus, the appearances of the phrase "one embodiment," "an embodiment", or the like, in various places throughout this specification are not necessarily referring to the same embodiment of the invention. Furthermore, the particular features, structures, configurations, or characteristics may be combined in any suitable manner in one or more embodiments.

The terms "over", "to", "between", and "on" as used herein may refer to a relative position of one layer or component with respect to other layers or components. One layer "over" or "on" another layer or bonded "to" another layer may be directly in contact with the other layer or may have one or more intervening layers. One layer "between" layers may be directly in contact with the layers or may have one or more intervening layers.

Without being limited to a particular theory, embodiments of the invention describe a micro pick up array supporting an array of electrostatic transfer heads which operate in accordance with principles of electrostatic grippers, using the attraction of opposite charges to pick up micro devices. In accordance with embodiments of the present invention, a pull-in voltage is applied to an electrostatic transfer head in order to generate a grip pressure on a micro device. The terms "micro" device or "micro" LED devices as used herein may refer to the descriptive size of certain devices or structures in accordance with embodiments of the invention, such as on a scale of 1 to 100 µm. However, embodiments of the present invention are not necessarily so limited, and certain aspects of the embodiments may be applicable to larger, and possibly smaller size scales. In an embodiment, a single micro device in an array of micro devices, and a single electrostatic transfer head in an array of electrostatic transfer heads both have a maximum dimension, e.g., a length or a width of a contact surface, of 1 to 100 µm. In an embodiment, a pitch of an array of micro devices, and a pitch of a corresponding array of electrostatic transfer heads is (1 to 100 µm) by (1 to 100 µm). At these densities a 6 inch carrier substrate, for example, can accommodate approximately 165 million micro LED devices with a 10 µm by 10 µm pitch, or approximately 660 million micro LED devices with a 5 µm by 5 µm pitch. A transfer tool including a micro pick up array and an array of electrostatic transfer heads matching an integer multiple of the pitch of the corresponding array of micro LED devices can be used to pick up, transfer, and bond the array of micro LED devices to a receiving substrate. In this manner, it is possible to integrate and assemble micro LED devices into heterogeneously integrated systems, including substrates of any size ranging from micro displays to large area displays, and at high transfer rates. For example, a 1 cm by 1 cm array of electrostatic transfer heads can pick up, transfer, and bond more than 100,000 micro devices per transfer operation, with larger arrays of electrostatic transfer heads being capable of transferring more micro devices.

In one aspect, embodiments of the invention describe a micro pick up array having an array of electrostatic transfer heads and one or more compliant contacts. The array of electrostatic transfer heads may be supported by a base substrate having a via. The compliant contact may include a flexible membrane over the via and supporting a plug within the via. The back side of the plug can be physically coupled with a transfer head assembly that can be used to position the micro pick up array including the array of electrostatic transfer heads. When a clamping force is applied to a clamping area on a backside of the micro pick up array, an operating voltage contact of the transfer head assembly may apply an opposing reactive load to the plug, causing the flexible membrane to deflect. Deflection of the flexible membrane may result in the base substrate moving around the plug to produce relative movement between the plug and the base substrate. Thus, while the micro pick up array is secured to the transfer head assembly by the clamping force, the reactive load creates compressive loading and pressure between the operating voltage contact of the transfer head assembly and the plug, such that a uniform electrical contact is provided therebetween.

In another aspect, embodiments of the invention describe a manner of forming a micro pick up array having an array of electrostatic transfer heads and one or more compliant contacts from a commercially available silicon-on-insulator (SOI) stack. Embodiments of the invention describe forming portions of the micro pick up array, e.g., an array of electrodes, an electrode interconnect, and one or more compliant contacts, etc., from the SOI stack using semiconductor device fabrication processes.

In another aspect, embodiments of the invention describe applying a voltage through the compliant contacts to the electrostatic transfer heads to create a gripping pressure between the array of electrostatic transfer heads and an array of micro devices. More specifically, an electrostatic charge may be generated at the array of electrostatic transfer heads to grip the array of micro devices during transfer. Furthermore, the electrostatic charge may be maintained by a voltage delivered to the electrostatic transfer heads through a plug of a compliant contact. Since the electrode circuit may operate under electrostatic conditions during most of the transfer operation, the plug may be considered to transfer an electrostatic voltage, rather than an electrical current. Thus, the pick up and placement of micro devices may be relatively insensitive to a response time of the electrode circuit and/or the plug. As a result, in an embodiment, an electrical resistance across the plug may be in a range higher than 1 to 1,000 ohms without compromising pick up and placement.

Referring now to FIG. 1, a perspective view of a transfer head assembly holding a micro pick up array with a compliant contact is illustrated in accordance with an embodiment of the invention. Transfer head assembly 102 may be a component of a larger system, such as a mass transfer tool used to transfer micro devices from a carrier substrate to a receiving substrate using micro pick up array 104. Transfer head assembly 102 may retain micro pick up array 104 in numerous manners, including clips, vacuum ports, and by clamping one or more clamping areas on a backside surface of micro pick up array 104 with an electrostatic gripping pressure. For example, in an embodiment, transfer head assembly 102 may include an electrostatic clamping contact that can receive an electrostatic voltage from a voltage source. The clamping contact may physically appose a clamping pad or clamping area on a backside surface of micro pick up array 104. Thus, micro pick up array 104 may be gripped and retained against the transfer head assembly 102 by the clamping contact.

In addition to delivering an electrostatic voltage to the clamping contact on the transfer head assembly 102 to grip the micro pick up array 104, the transfer head assembly 102 may deliver one or more electrostatic transfer head operation voltages to from voltage sources 106, 206 to voltage interconnects 108 of micro pick up array 104. Voltage interconnects 108 may be compliant contacts. In addition to being compliant contacts, voltage interconnects 108 may also relay electrostatic voltage through micro pick up array 104 into electrode interconnects 112 toward an array of electrostatic transfer heads 114. Thus, micro pick up array 104 may include compliant contacts that are both compliant and able to transfer electrostatic voltage through micro pick up array 104.

Figure 2A:
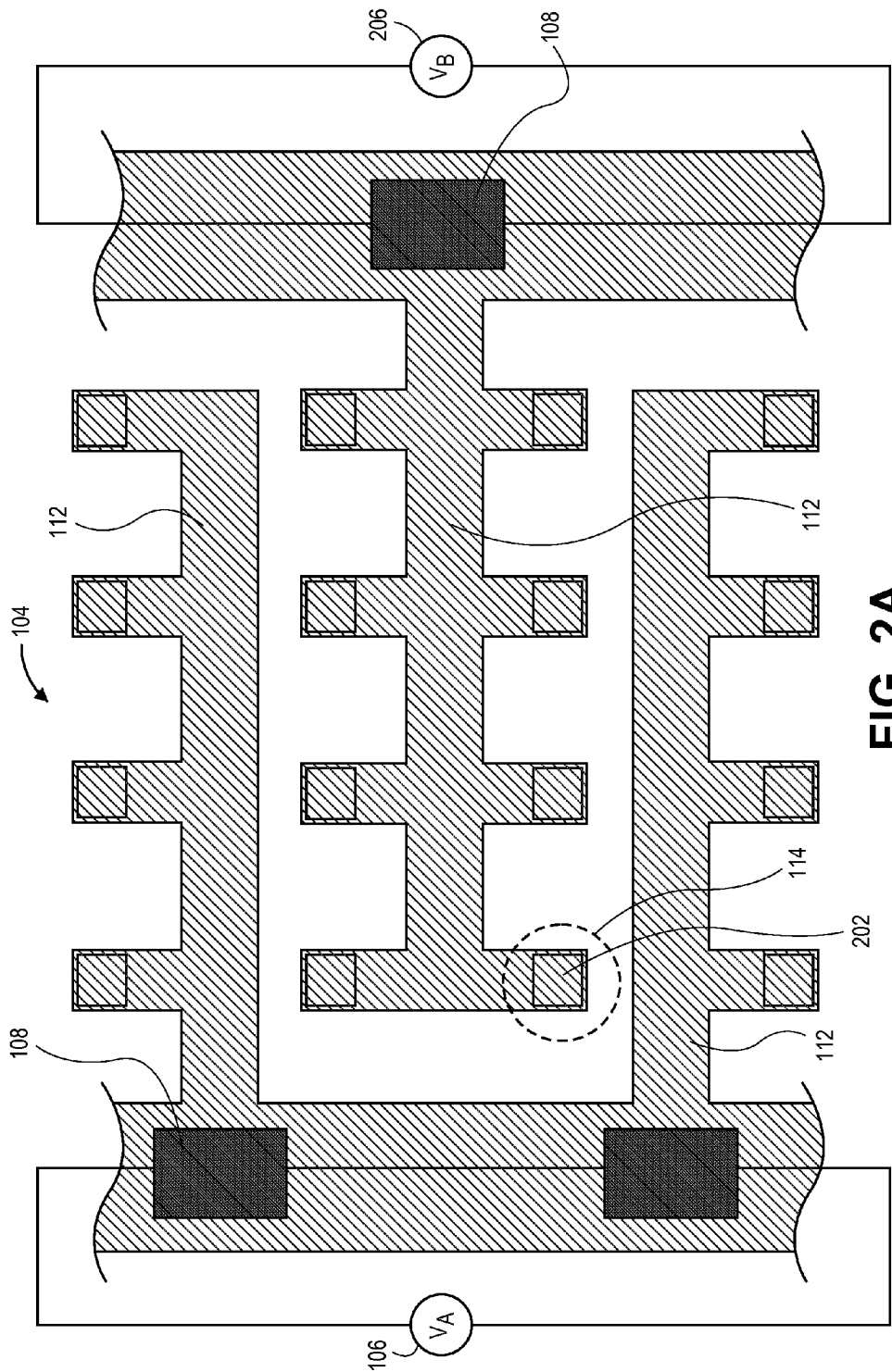
FIG. 2A is a plan view illustration of a micro pick up array having an array of monopolar electrostatic transfer heads in accordance with an embodiment of the invention.

Referring now to FIG. 2A, a plan view illustration of a micro pick up array having an array of monopolar electrostatic transfer heads is illustrated in accordance with an embodiment of the invention. The micro pick up array 104 may include a plurality of electrostatic transfer heads 114 formed in an array on a front side surface. Each electrostatic transfer head 114 may be electrically coupled with an electrode interconnect 112 running over the front side surface and placed in electrical connection with a voltage interconnect 108. The voltage interconnect 108 may include numerous structures, which are described further below and allow for the transfer of voltage from a back side surface of the micro pick up array 104 to the front side surface. For example, in an embodiment, voltage interconnect 108 includes a compliant contact having a plug and a flexible membrane. Thus, when micro pick up array 104 is electrically coupled with voltage source 106, a voltage can be transferred to electrode surface 202 on electrostatic transfer head 114.

In the embodiment illustrated in FIG. 2A, the voltage interconnect 108 on the left side of the illustration may be connected to voltage source 106 denoted $V_A$, and the voltage interconnect 108 on the right side of the illustration may be connected to a voltage source 206 denoted $V_B$. Alternatively, the voltage interconnect 108 on the right side of the illustration may connect to the voltage source 106 denoted $V_A$. Where each transfer head is operable as a monopolar transfer head, voltage sources 106 denoted $V_A$ and 206 denoted $V_B$ may simultaneously apply the same voltage so that each electrode surface 202 has the same voltage. However, as described below, this arrangement for monopolar electrostatic transfer heads 114 is not limiting.

Figure 2B:
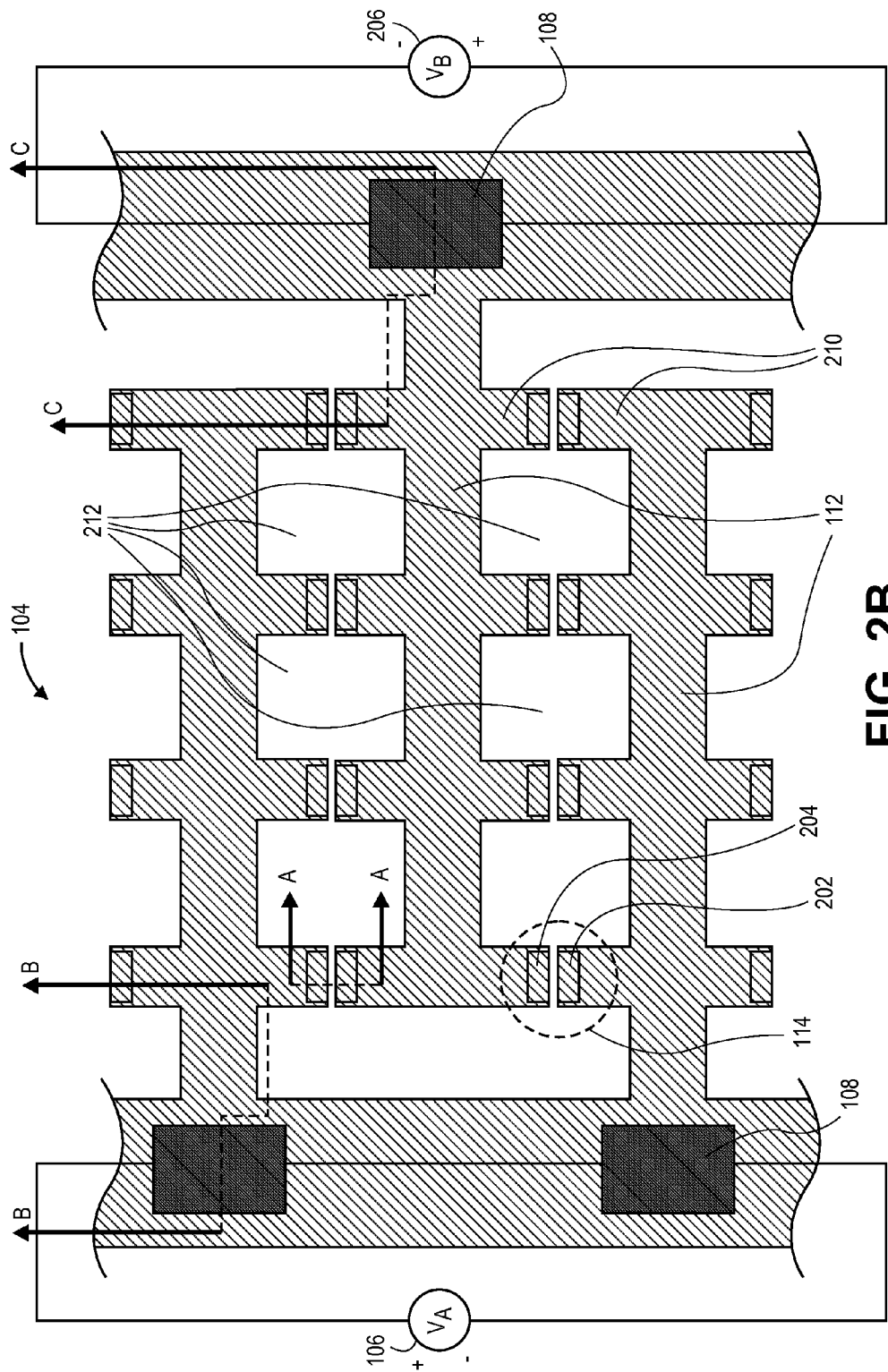
FIG. 2B is a plan view illustration of a micro pick up array having an array of bipolar electrostatic transfer heads in accordance with an embodiment of the invention.

Referring now to FIG. 2B, a plan view illustration of a micro pick up array 104 having an array of bipolar electrostatic transfer heads 114 is illustrated in accordance with an embodiment of the invention. As in FIG. 2A, each electrostatic transfer head 114 may be electrically coupled with voltage interconnects 108 through electrode interconnects 112. The voltage interconnects 108 may include a compliant contact, as in FIG. 2A. However, in the embodiment illustrated in FIG. 2B, each electrostatic transfer head 114 is bipolar, and includes electrode surface 202 and second electrode surface 204. Thus, in an embodiment, the upper and lower electrode interconnects 112 in the illustration may be connected to a voltage source 106 denoted $V_A$, and the middle electrode interconnect 112 in the illustration may be connected to a second voltage source 206 denoted $V_B$. Where each electrostatic transfer head 114 is operable as a bipolar transfer head, voltage source 106 denoted $V_A$ may simultaneously apply a voltage to electrode surface 202 that is opposite to a voltage applied to second electrode surface 204 by second voltage source 206 denoted $V_B$. Thus, each electrostatic transfer head 114 may include a pair of oppositely charged electrodes, leading to enhanced gripping pressures on corresponding micro devices. For example, gripping pressures between each bipolar electrostatic transfer head 114 and a corresponding micro device can be about 20 atm or higher.

The monopolar and bipolar electrostatic transfer head configurations may be interchangeable in various embodiments of micro pick up array 104. Indeed, micro pick up array 104 may include alternative patterns for the array of electrostatic transfer heads 114, electrode interconnects 112, etc., depending on the available space on transfer head assembly 102, the micro device pattern on the carrier substrate, the bonding pattern on the receiving substrate, and other features incorporated in micro pick up array 104. For example, micro pick up array 104 may optionally include features such as flexible cantilever beams 210 that suspend electrostatic transfer heads 114 over one or more cavities 212 underneath the array of electrostatic transfer heads 114. Electrode interconnects 112 may be routed over or within flexible cantilever beams 210 over cavities 212.

Although the description below is made in relation to a bipolar electrode configuration, the description is also applicable to other electrode configurations, e.g., monopolar electrode configurations. Furthermore, although the description below is made in relation to micro pick up array 104 incorporating cavities 212, such features are not required. The compliant contacts described below may be incorporated into a variety of micro pick up array designs and are not limited to the specific micro pick up array embodiments described and illustrated herein.

Figure 3:
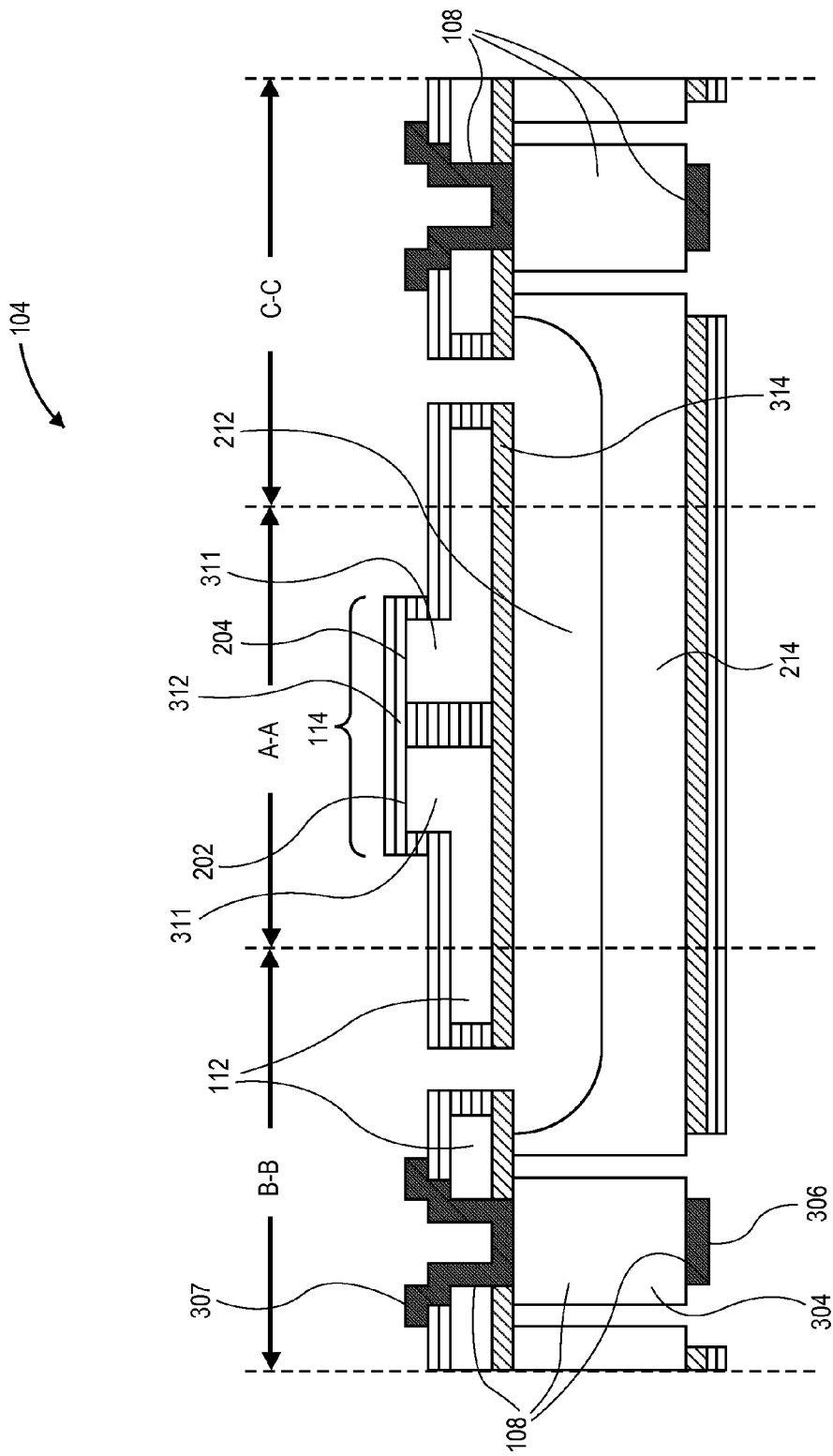
FIG. 3 is a combination cross-sectional side view illustration taken along lines A-A, B-B, and C-C of FIG. 2B illustrating a micro pick up array having an array of electrostatic transfer heads electrically coupled with a compliant contact in accordance with an embodiment of the invention.

Referring now to FIG. 3, a combination cross-sectional side view illustration is taken along lines A-A, B-B, and C-C of FIG. 2B illustrating a micro pick up array having an array of electrostatic transfer heads electrically coupled with a pair of compliant contacts in accordance with an embodiment of the invention. The combination views do not precisely represent the sizes or locations of the features of micro pick up array 104, but rather, are intended to combine features into a single view for ease of description. For example, while the combination cross-sectional side view illustrations show voltage interconnect 108 of FIG. 2B having plug 304, contact pad 306, and topside contact 307 electrically connected with only one electrode surface 202 through electrode interconnect 112, it is clear from FIG. 2B and the accompanying description that voltage interconnect 108 may be electrically connected with several electrode surfaces 202 through one or more electrode interconnects 112.

In an embodiment, the cross-section taken along line A-A corresponds to a portion of micro pick up array 104 that includes a bipolar electrostatic transfer head 114. The bipolar electrostatic transfer head 114 includes electrode surface 202 and second electrode surface 204, both over a top surface of mesa structures 311. A dielectric layer 312 may cover electrode surface 202 and second electrode surface 204, and may also cover a side surface of mesa structures 311 laterally between the pair of mesa structures 311 for the pair of electrodes in a bipolar electrostatic transfer head 114. Thus, the top surface of dielectric layer 312 over electrode surface 202 and second electrode surface 204 is offset from, e.g., above electrode interconnect 112, and provides a raised contact point for pressing against a micro device on a carrier substrate or receiving substrate.

In an embodiment, dielectric layer 312 and buried oxide layer 314 surround and separate mesa structures 311 and electrode interconnect 112 of individual electrode circuits from each other and from other portions of micro pick up array 104 to isolate a desired pathway between voltage sources 106, 206 and respective electrostatic transfer heads 114, and to prevent shorting between electrode surfaces 202, 204, electrode interconnects 112, and voltage interconnects 108 that are maintained at different electrical potentials.

The embodiment illustrated in FIG. 3 includes electrostatic transfer head 114 supported above cavity 212 by a flexible cantilever beam 210, such that electrostatic transfer head 114 is deflectable into cavity 212. In other embodiments, cavity 212 is not present.

Figure 4A:
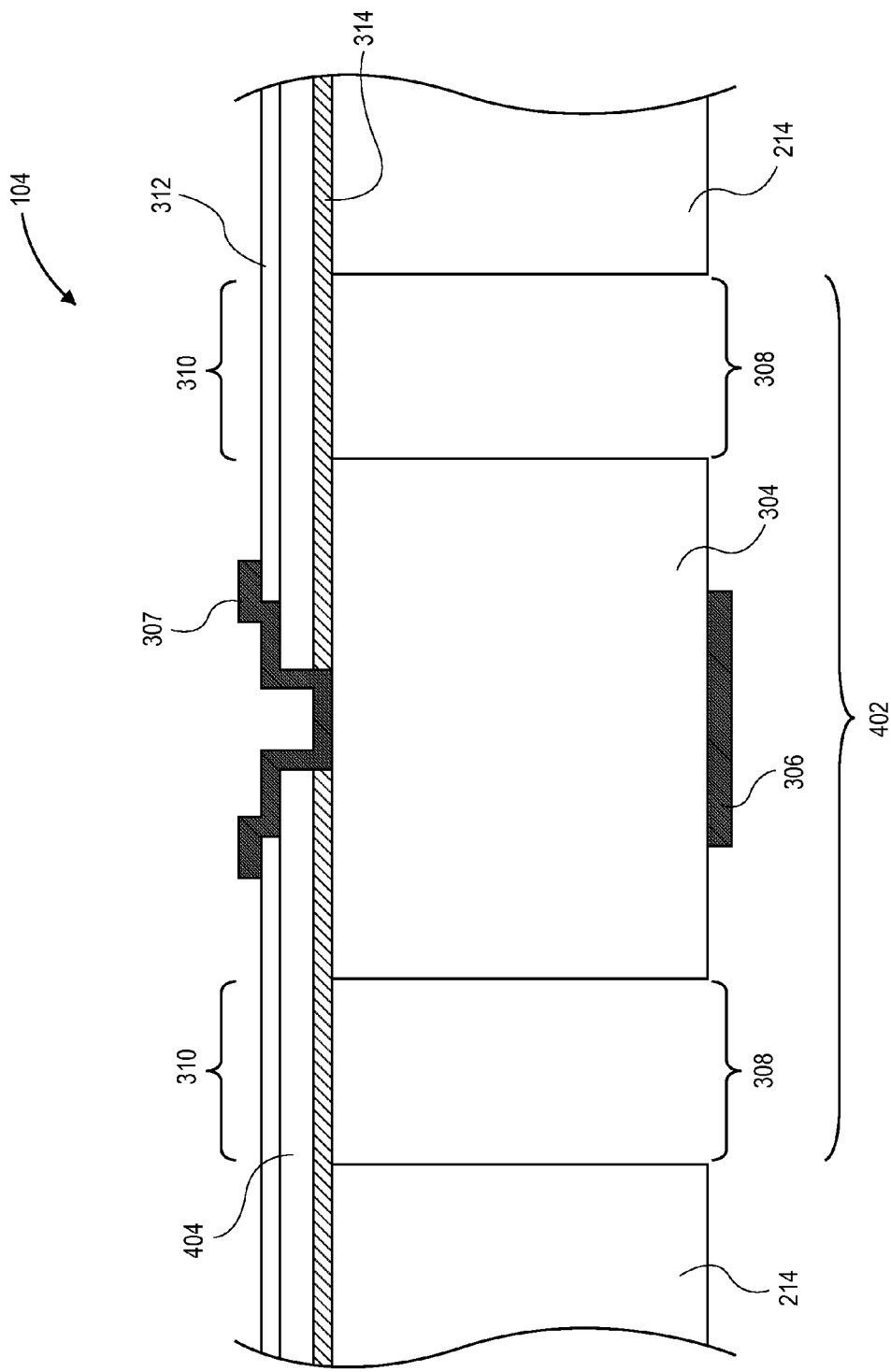
FIG. 4A is a cross-sectional side view illustration taken along a portion of line B-B or C-C of FIG. 2B illustrating a compliant contact in accordance with an embodiment of the invention.

Referring now to FIG. 4A, a cross-sectional side view illustration taken along a portion of line B-B or C-C of FIG. 2B illustrates a compliant contact in accordance with an embodiment of the invention. More specifically, the cross-section taken along lines B-B or C-C corresponds to a portion of micro pick up array 104 that includes voltage interconnect 108 having a compliant contact. Thus, voltage interconnect 108 transfers voltage from a voltage source 106 or 206 to electrode interconnect 112, but may also be moveable relative to other portions of micro pick up array 104, e.g., base substrate 214 or electrostatic transfer head 114. In an embodiment, base substrate 214 includes via 402 extending from a backside surface of micro pick up array 104 to buried oxide layer 314. Via 402 may have numerous cross-sectional shapes, for example, via 402 may be cylindrical and have a circular cross-section. Alternatively, the cross-section of via 402 may be rectangular, rectangular with rounded corners, oval, etc.

In an embodiment, via 402 is partially filled by plug 304, which extends through via 402 from buried oxide layer 314 and is laterally separated from the surrounding base substrate 214 by gap 308. Plug 304 may be formed separately or simultaneously with via 402. For example, in an embodiment, plug 304 may be deposited onto a backside surface of buried oxide layer 314 through via 402. In an alternative embodiment, gap 308 may be formed by etching through a bulk silicon substrate, and thus, plug 304 is defined by the removal of material occupying gap 308. Regardless of the method used to form via 402 and plug 304, gap 308 may surround the periphery of plug 304, resulting in plug 304 being coupled with base substrate 214 by flexible membrane 310. As illustrated in FIG. 4A, the width of flexible membrane 410 may be represented by the gap 308 surrounding the periphery of plug 304. For example, where via 402 and plug 304 are circular, the width of flexible membrane 410 may be the difference in the radii of the via 402 and plug 304.

Since gap 308 may extend around the periphery of plug 304, it may provide a dielectric barrier between plug 304 and base substrate 214. More particularly, gap 308 may prevent discharge from plug 304 to base substrate 214 when a voltage is applied to plug 304 from voltage source 106 or 206. To function as a dielectric barrier, gap 308 may be shaped and sized depending on the operating voltage of micro pick up array 104. For example, in some embodiments, micro pick up array 104 operates with an electrostatic voltage of between about 100 to 150 volts applied through contact pad 306 and plug 304 to electrostatic transfer heads 114. Accordingly, gap 308 may be an air-filled space around plug 304 with a breakdown voltage of at least 100 volts at ambient pressure. In an embodiment, assuming that the breakdown voltage of air is about 327 volts at standard atmospheric pressure across a gap distance of 7.5 μm, gap 308 distance may be maintained higher than about 10 μm to prevent discharge across gap 308. In an embodiment, the minimum distance across gap 308 may be between about 10 and 300 μm or more to prevent breakdown at normal operating conditions. More specifically, the minimum distance across gap 308 may be chosen to be about 20 μm.

Plug 304 may be concentrically located within via 402 such that gap 308 is uniformly distributed around plug 304 periphery. Alternatively, plug 304 may be configured within via 402 such that gap 308 distance between plug 304 and base substrate 214 varies. For example, via 402 may be shaped differently from plug 304, or plug 304 may be eccentrically located within via 402, such that gap 308 distance varies. Nonetheless, a minimum distance across the gap 308 may be controlled to achieve the required breakdown voltage and to accommodate the operating voltage delivered through plug 304.

Referring now to FIG. 4B, a cross-sectional side view illustration taken along a portion of line B-B or C-C of FIG. 2B illustrates a compliant contact with a dielectric-filled gap in accordance with an embodiment of the invention. In alternative embodiments, the breakdown voltage of the gap 308 may be controlled by introducing a suitable dielectric substance into gap 308. For example, gap 308 may be filled with a fluid that deforms under shear stress. For example, gap 308 may be filled with a liquid dielectric 406, such as a silicone oil, that does not impede relative movement between plug 304 and base substrate 214, but which also has a higher dielectric constant than air and allows for the distance across gap 308 to be narrowed, as compared to gap 308 filled with air, while still maintaining the requisite breakdown voltage of gap 308. The gap can be filled with liquid dielectric 406 by, for example, dispensing liquid dielectric 406 into gap 308 using an air-powered fluid dispenser, a syringe, or another type of dispenser that can inject controlled volumes of fluid into small areas. Depending on the viscosity of liquid dielectric 406 that is inserted into gap 308, there may be a need to retain liquid dielectric 406. For example, in the case where surface tension alone is unable to keep liquid dielectric 406 from flowing out of gap 308, a seal 408 may be formed over or within gap 308 to prevent liquid dielectric 406 from leaving gap 308. In an embodiment, seal 308 may include a flexible adhesive material, such as a silicone polymer, deposited as a thin layer within gap 308 to bond with base substrate 214 and plug 304 while retaining liquid dielectric 406. Seal 408 may be thin and flexible so as not to impede relative movement between plug 304 and base substrate 214.

In an alternative embodiment, non-liquid dielectrics, such as solid or gaseous dielectric materials may be introduced into and sealed within gap 308. For example, gap 308 may be at least partially filled with a solid dielectric including polymers such as acrylic, polyimide, or epoxies. The polymer dielectric may be introduced into gap 308 using an ink-jetting process.

In FIGS. 4A-4B, flexible membrane 310 may permit relative movement between plug 304 and base substrate 214. In an embodiment, flexible membrane 310 may be sized to flex when opposing loads are applied to plug 304 and base substrate 214. The physical dimensions and material properties of top silicon layer 404 and gap 308 may be the leading contributors to the overall stiffness and flexibility of flexible membrane 310. In an embodiment, an overall thickness of flexible membrane 310 includes portions of top silicon layer 404, buried oxide layer 314, and dielectric layer 312 that are located over via 402. In an embodiment, the width of flexible membrane 310 may be between about 10 to 50 times the overall thickness of flexible membrane 310. For example, where the width of the flexible membrane is 10 times the overall thickness of flexible membrane 310, the thickness is about 5 μm while, as described above, flexible membrane 310 width may be about 50 μm.

Figure 5:
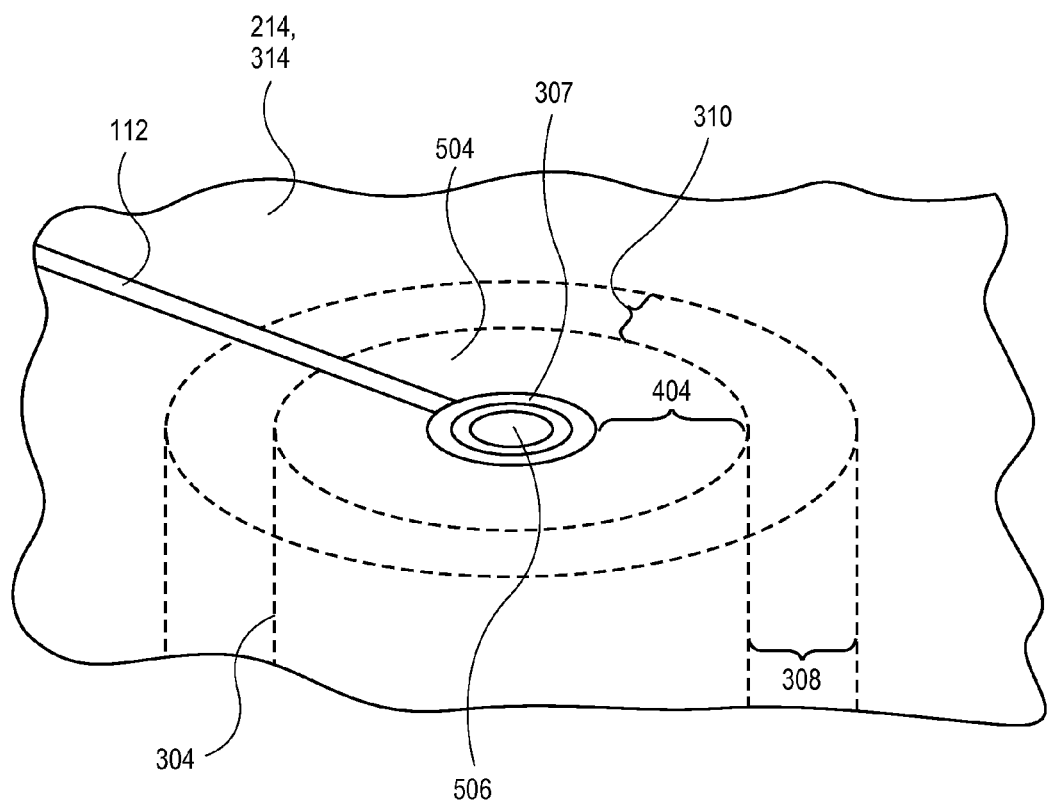
FIG. 5 is a perspective view illustration of a topside portion of a micro pick up array having a compliant contact in accordance with an embodiment of the invention.

Referring now to FIG. 5, a perspective view illustration of a topside portion of a micro pick up array having a compliant contact is illustrated in accordance with an embodiment of the invention. In an embodiment, electrode interconnect 112 includes an electrode trace, wire, or other connector electrically connected with topside contact 307. For example, electrode interconnect 112 may run over buried oxide layer 314 and base substrate 214 from mesa structure 311 to topside contact 307. A path of electrode interconnect 112 may vary depending on the topside geometry of micro pick up array 104, taking into account features such as flexible cantilever beams 210 supporting electrostatic transfer heads 114. Therefore, electrode interconnect 112 pattern may include various bends, curves, etc. Furthermore, dielectric layer 312 may cover electrode interconnect 112. In contrast, rather than being covered by dielectric layer 312, topside contact 307 may instead extend through dielectric layer 312, electrode interconnect 112, and buried oxide layer 314, to a topside plug area 504.

Topside plug area 504 is represented with hidden lines to illustrate that it may be supported by flexible membrane 310 and under buried oxide layer 314. Topside plug area 504 may correspond to a portion of plug 304 that apposes buried oxide layer 314. Thus, topside contact 307 may contact topside plug area 504 over contact area 506. Contact area 506 may be proportionally less than topside plug area 504 because contact area 506 may be no larger than plug 304 width and because minimizing contact area 506 mitigates the risk of buried oxide layer 314 delaminating from topside plug area 504. In an embodiment, contact area 506 may be less than about half of topside plug area 504. For example, contact area 506 may have an effective diameter of between about 50 to 100 μm while topside plug area 504 may have an effective diameter of between about 300 to 500 μm. However, other contact area 506 and topside plug area 504 dimensions may be used to similarly minimize the ratio between contact area 506 and topside plug area 504, and to provide a strong interface between topside plug area 504 and buried oxide layer 314.

Topside contact 307 may also transfer voltage. In an embodiment, topside contact 307 provides an electrical pathway from plug 304 to electrode interconnect 112 through buried oxide layer 314 without considerably compromising the function of flexible membrane 310. To provide this pathway, topside contact 307 may be formed from various conductive materials, such as gold, NiCr, Cr, TiW, Ti, Al, alloys thereof or polysilicon, that provide for electrical conductivity between plug 304 and electrode interconnect 112.

As described above with regard to the structures shown along lines A-A and B-B of FIG. 3, voltage interconnect 108 may include contact pad 306 on a backside surface of plug 304. Contact pad 306 may be electrically coupled with a corresponding operating voltage contact of transfer head assembly 102 to transfer voltage from voltage source 106 or 206. Thus, voltage may be delivered through contact pad 306 into plug 304, and toward topside contact 307 on topside plug area 504. Topside contact 307 may further be electrically coupled with electrode interconnect 112, and resultantly, voltage may be delivered from voltage source 106 or 206 through plug 304 and electrode interconnect 112 to electrode surface 202. Furthermore, voltage source 106 or 206 may transfer voltage to second electrode surface 204 of a bipolar electrostatic transfer head 114 in a similar manner using corresponding structures shown along lines A-A and C-C of FIG. 3.

Operation of micro pick up array 104 may include the application and removal of voltage to and from the array of electrostatic transfer heads 114. For example, voltage may be applied to electrostatic transfer heads 114 through plug 304 to grip micro devices and the voltage may be removed from electrostatic transfer heads 114 to release micro devices. This application and removal may be accompanied by a spike in electrical current as charge is generated or dissipated in the array of electrostatic transfer heads 114. However, during steady state operation of the array of electrostatic transfer heads 114, minimal or no current is required to be delivered through plug 304 since the charge can be maintained with minimal power draw from voltage source 106 or 206. Therefore, electrical resistance across plug 304 between contact pad 306 and topside contact 307 may be less than about 25 kiloohms without degrading the RC time constant of an electrode circuit to a point that micro pick up array 104 is unable to transfer micro devices in the manner described below. More specifically, since the pick up and placement of micro devices occurs over relatively long periods of time, e.g., seconds, as compared to the response time of the electrode circuit, e.g., microseconds, resistance across plug 304 may be increased without disrupting the ability to pick up or place the micro devices. For example, electrical resistance across plug 304 between contact pad 306 and topside contact 307 may be in a range higher than 1 to 1,000 ohms. In an embodiment, electrical resistance across plug 304 may be in the megaohm range without compromising the transfer of micro devices as described in the following description. More specifically, in an embodiment, plug 304 has a nominal resistance value in a range of about 1 to 100 kiloohms.

Figure 6A:
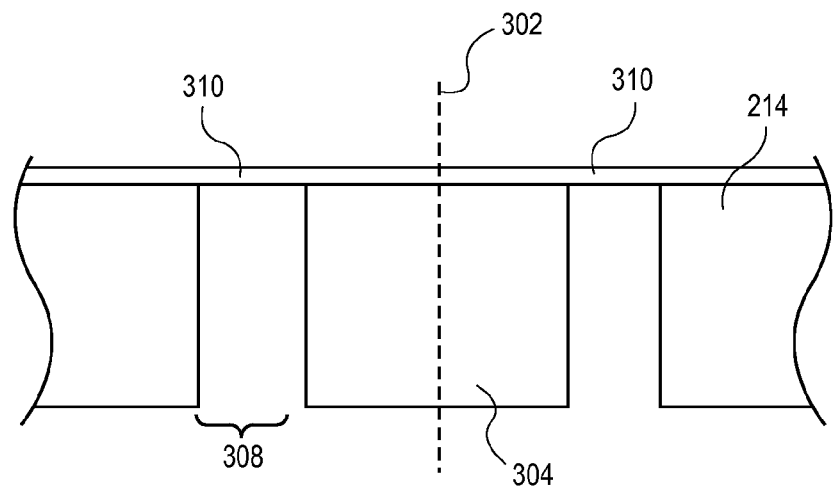
FIG. 6A is a cross-sectional side view illustration of a moveable portion of a micro pick up array having a compliant contact supported by a flexible membrane in accordance with an embodiment of the invention.

Referring now to FIG. 6A, a cross-sectional side view illustration of a moveable portion of a micro pick up array having a compliant contact supported by a flexible membrane is illustrated in accordance with an embodiment of the invention. Prior to attaching micro pick up array 104 to transfer head assembly 102, i.e., when no external loads are being applied to micro pick up array 104, flexible membrane 310 may have sufficient resilience to flatten across gap 308 and bring plug 304 into alignment with base substrate 214 relative to axis 302.

Figure 6B:
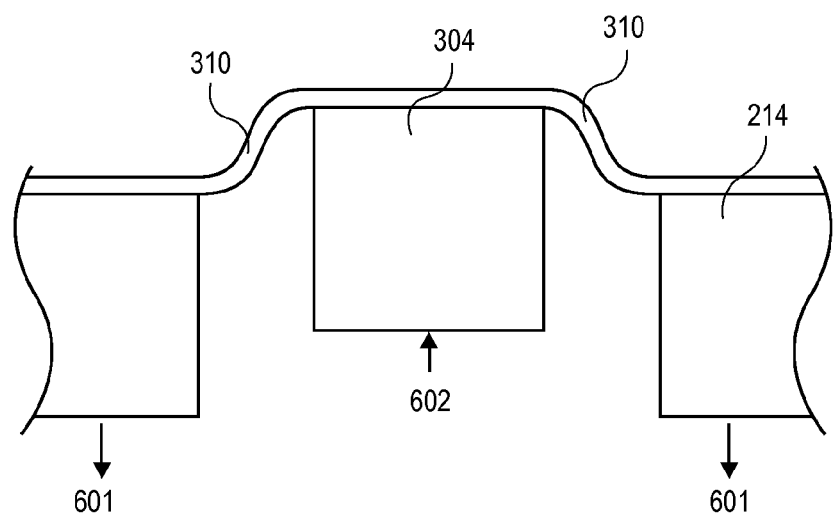
FIG. 6B is a cross-sectional side view illustration of a moveable portion of a micro pick up array having a load applied to a compliant contact supported by a flexible membrane in opposition to a clamping force applied to a clamping area of the micro pick up array in accordance with an embodiment of the invention.

Referring now to FIG. 6B, a cross-sectional side view illustration of a moveable portion of a micro pick up array having a load applied to a compliant contact supported by a flexible membrane in opposition to a clamping force applied to a clamping area of the micro pick up array is illustrated in accordance with an embodiment of the invention. When micro pick up array 104 is clamped to transfer head assembly 102, e.g., by applying an electrostatic clamping load 601 to pull a clamping area over base substrate 214 toward a clamping contact of transfer head assembly 102, reactive load 602 may be applied to plug 304 by an operating voltage contact of transfer head assembly 102. This reactive load may be applied, for example, due to a mismatch in position between a surface of the clamping contact and a surface of the operating voltage contact. More specifically, the operating voltage contact may extend further from transfer head assembly 102 than the clamping contact. Accordingly, the operating voltage contact touches contact pad 306 before the clamping contact touches the clamping area over base substrate 214 and flexible membrane 310 encounters a bending moment that causes it to deflect. This deflection permits plug 304, which floats within via 402, to move relative to base substrate 214. As flexible membrane 310 deflects and plug 304 moves, both base substrate 214 and plug 304 remain in contact with the clamping contact and operating voltage contact of transfer head assembly 102, respectively. More specifically, flexible membrane 310 accommodates relative movement between base substrate 214 and plug 304 to allow micro pick up array 104 to be secured to transfer head assembly 102 while establishing an electrical connection between plug 304 and voltage sources 106, 206.

The deflection of flexible membrane 310, and thus the movement of base substrate 214 relative to plug 304, depends on numerous characteristics of the micro pick up array 104, and each of these characteristics may be modifiable to adjust the degree of movement between base substrate 214 and plug 304 that results from, e.g., various offsets between surfaces of a clamping contact and an operating voltage contact of the transfer head assembly 102. Without exhaustively listing these variables, some of the micro pick up array 104 characteristics that may be modified are width of flexible membrane 310 and stiffness of top silicon layer 404 (FIG. 4). An example of the impact of just these two variables is provided through a model in which top silicon layer 404 within flexible membrane 310 has a thickness of 5 µm. In a first instance, where flexible membrane 310 is modeled with a gap 308 width of 50 µm and top silicon layer 404 has a stiffness of 233 mN/µm, movement of base substrate 214 relative to plug 304 is estimated to be about 0.4 µm when a clamping load 601 and reactive load 602 correspond to a 300 MPa pressure applied to plug 304. Alternatively, when the same pressure is applied to a plug 304 with a flexible membrane 310 having a gap 308 width of 100 µm and a top silicon layer 404 with a stiffness of 34 mN/µm, movement of plug 304 relative to base substrate 214 is estimated to be about 1.1 µm. In either of these alternatives, via 402 may have a diameter of about 2000 µm and a depth of about 600 µm. These estimates show not only that movement of plug 304 is affected by factors that are both external and internal to micro pick up array 104, e.g., gap width (internal factor) and loading pressure (external factor), but also illustrates that these factors are controllable through micro pick up array 104 design to tune movement of plug 304 relative to base substrate 214 under the expected operating conditions of micro pick up array 104.

Figure 25:
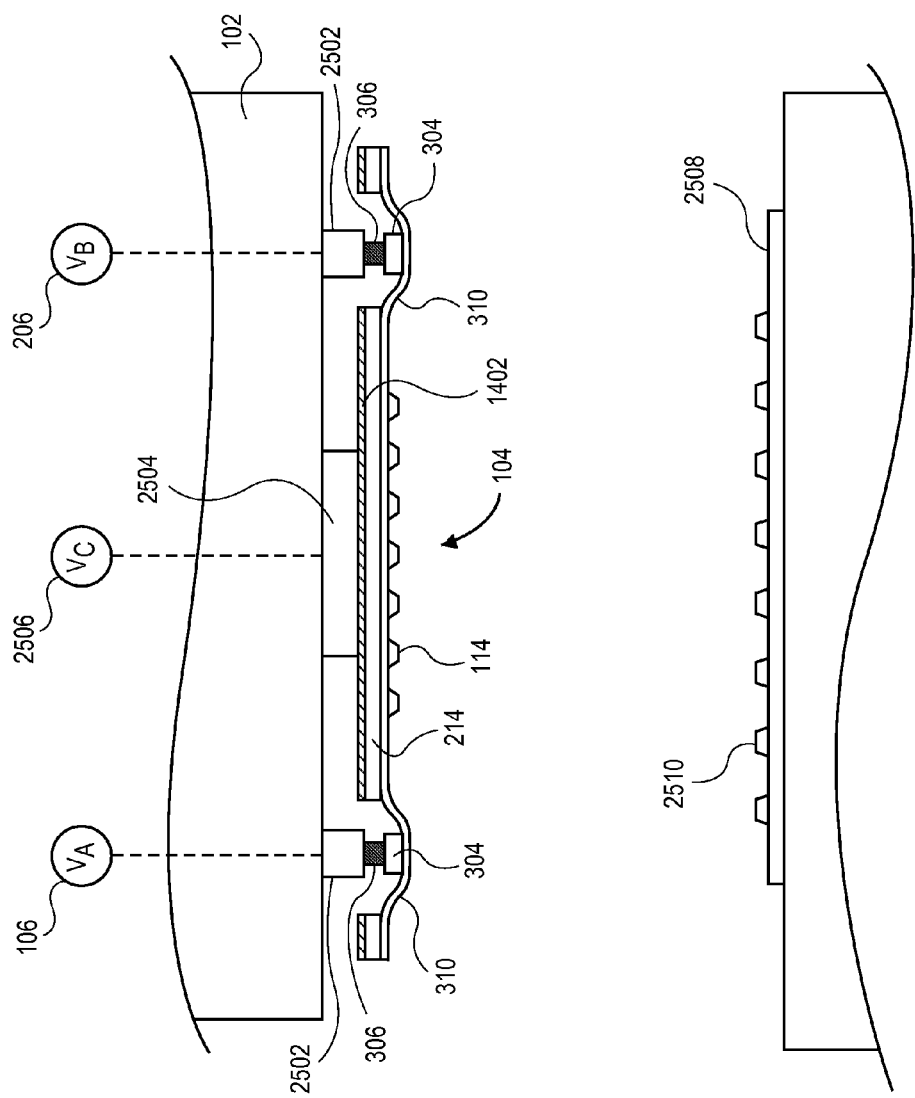
FIG. 25 is a cross-sectional side view illustration of a system having a micro pick up array and a transfer head assembly in accordance with an embodiment of the invention.

Referring now to FIG. 25, a cross-sectional side view of a system having a micro pick up array and a transfer head assembly is shown in accordance with an embodiment of the invention. Micro pick up array 104 may be physically and electrically coupled with transfer head assembly 102. More specifically, base substrate 214 of micro pick up array 104, or more particularly backside dielectric layer 1402 over base substrate 214, may be physically secured to a clamping contact 2504 of transfer head assembly 102. Contact pad 306 of micro pick up array 104 may also be electrically coupled with an operating voltage contact 2502 of transfer head assembly 102.

Transfer head assembly may include one or more clamping contact 2504. In an embodiment, clamping contact 2504 is electrically coupled with a clamping voltage source 2506 to supply an electrostatic voltage to clamping contact 2504. Clamping contact 2504 may include a conductive electrode, optionally covered by a thin dielectric layer. Thus, by aligning the energized clamping contact 2504 with a backside of base substrate 214, an electrostatic voltage may be supplied to clamping contact 2504 that exerts clamping load 601 on base substrate 214. Clamping load 601 may pull in on base substrate 214 to physically secure micro pick up array 104 to transfer head assembly 102.

Transfer head assembly may also include one or more operating voltage contacts 2502. In an embodiment, an operating voltage contact 2502 is aligned with a contact pad 306 prior to securing micro pick up array 104 to transfer head assembly 102. Operating voltage 2502 may include a bare conductor, such as a metallic pin. In accordance with embodiments of the invention, as base substrate 214 is attracted toward clamping contact 2504, operating voltage contacts 2502 and exerts a reactive load 602 upon contact pad 306. Reactive load 602 may deflect flexible membrane 310, causing plug 304 to move relative to base substrate 214 and create a residual compressive load between operating voltage contact 2502 and clamping pad 306. This residual compressive load may persist while micro pick up array 104 is secured to transfer head assembly 102. Furthermore, the residual compressive load may result in a firm pressure between the contacting surfaces that creates a uniform surface interface and a robust electrical contact. Therefore, the flexibility of flexible membrane 310 allows for an electrostatic voltage to be reliably supplied from voltage sources 106, 206 through one or more operating voltage contacts 2502 into one or more contact pads 306.

Figure 12:
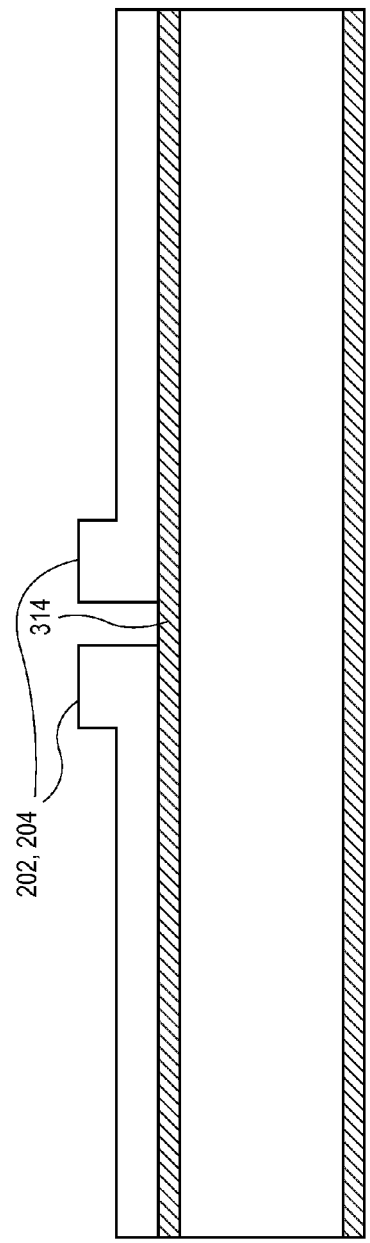
Figure 13:
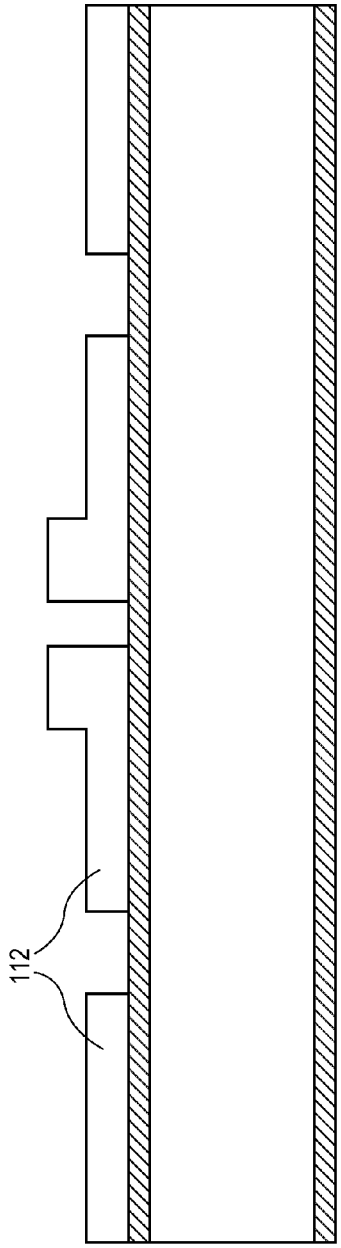

In accordance with some embodiments of the invention, the top contact surfaces of the electrostatic transfer heads 114 protrude further away from the micro pick up array than the surfaces adjacent the deflected compliant contacts. In this manner the deflected compliant contacts do not interfere with operation of the transfer head assembly. For example, in the exemplary embodiments described above the plug moves 0.4 μm-1.1 μm relative to the base substrate when deflected. As will be described in further detail below, the height of the electrostatic transfer heads may be greater than the range of deflection of the compliant contacts. In an embodiment, the height of the mesa structures defining electrode surfaces 202, 204 (see FIG. 12) rising above the silicon interconnects 112 is greater than range of relative movement between the plug and base substrate.

Figure 26:
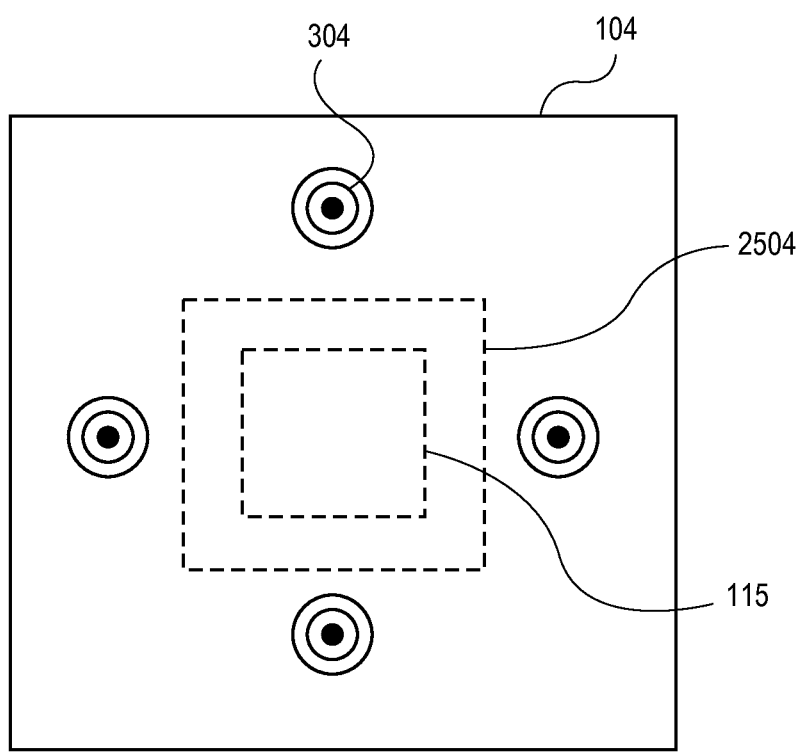
FIG. 26 is a schematic top view illustration of contacts between a micro pick up array and a transfer head assembly in accordance with an embodiment of the invention.

FIG. 26 is a schematic top view illustration of contacts between a micro pick up array and a transfer head assembly in accordance with an embodiment of the invention. In one embodiment, the contact area of the one or more clamping contacts 2504 on the transfer head assembly may be larger than the area 115 on the micro pick up array containing the array of transfer heads 114. Thus, the contact area of the clamping contact(s) 2504 may be around the area 115 containing the array of transfer heads 114. In this manner, the alignment and planarity across the array of transfer heads 114 can be regulated by the alignment of the transfer head assembly. In such an embodiment, a plurality of compliant contacts, referenced by the plugs 304 in FIG. 26, are outside the periphery of the areas 2504, 115. In the particular embodiment illustrated, compliant contacts are positioned on four sides of the area 115 including the array of transfer heads 114.

Figure 7:
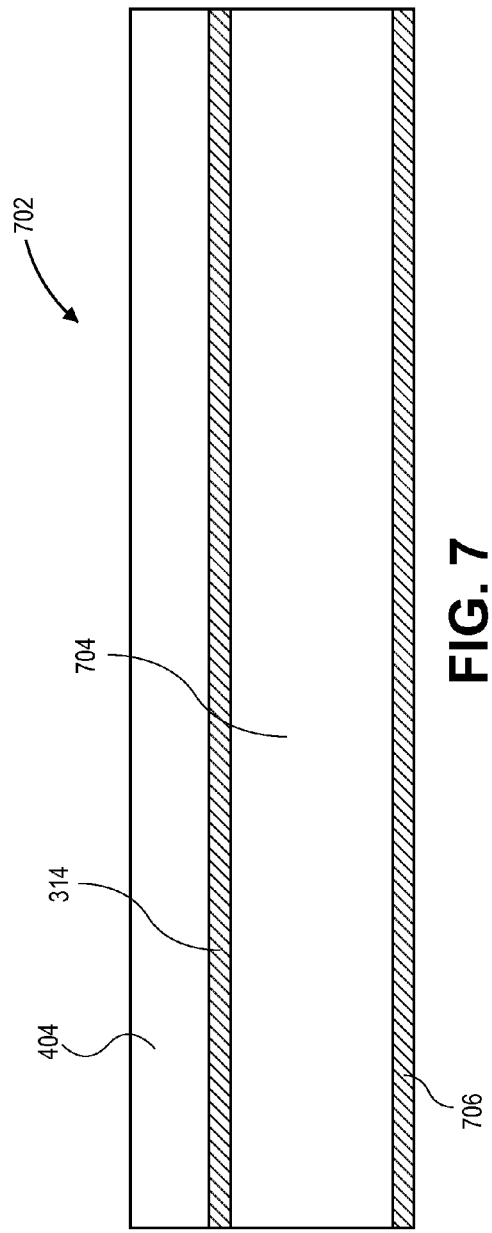

Referring now to FIG. 7-24, a method of forming a micro pick up array having an array of electrostatic transfer heads electrically coupled with one or more compliant contacts is illustrated in accordance with an embodiment of the invention. The processing sequence may begin with a commercially available SOI stack 702, as illustrated in FIG. 7. The SOI stack 702 may include bulk silicon substrate 704, top silicon layer 404, buried oxide layer 314 between bulk silicon substrate 704 and the top silicon layer 404, and backside oxide layer 706. In an embodiment, bulk silicon substrate 704 is a silicon (100) handle wafer having a thickness of 500 μm+/−50 μm, buried oxide layer 314 is 1 μm+/−0.1 μm thick, and top silicon layer 404 is 7-20 μm+/−0.5 μm thick. The top silicon layer 404 may also be doped to improve conductivity. For example, a phosphorous dopant concentration of approximately $10^{17}$ cm$^{-3}$ yields a resistivity of less than 0.1 ohm-centimeter. In an embodiment, the backside oxide layer 706 is a thermal oxide having a thickness up to about 2 μm thick, which is the approximate upper limit for thermal oxidation of silicon.

Figure 8:
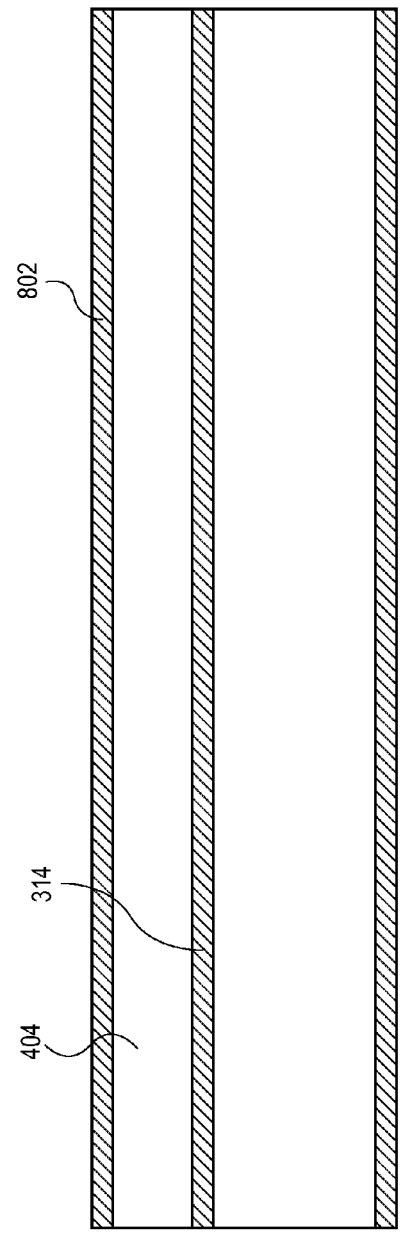

Referring to FIG. 8, a mask layer 802 may be formed over the top silicon layer 404. Mask layer 802 may be deposited, or alternatively thermally grown from the top silicon layer 404. In an embodiment, mask layer 802 is a thermally growth $SiO_2$ layer having a thickness of approximately 0.1 μm. In an embodiment, where mask layer 802 is thermally growth $SiO_2$, the mask layer 802 has a thickness which is significantly less than the thickness of buried oxide layer 314. This helps maintain structural stability for the partially patterned SOI stack 702 during removal of the patterned mask layer 802.

Referring to FIG. 9, the mask layer 802 is then patterned to form an array of islands 902 which will correspond to the mesa structures 311 of electrostatic transfer heads 114. In an embodiment, mask layer 802 is a thermally grown $SiO_2$ layer, and islands 902 are formed by applying a positive photoresist, exposing, and removing undeveloped areas of the photoresist with a potassium hydroxide (KOH) developer solution. The mask layer 802 is then dry etched, stopping on top silicon layer 404, to form islands 902 using a suitable technique such as ion milling, plasma etching, reactive ion etching (RIE).

The array of islands 902 correspond to mesa structures 311 of electrostatic transfer heads 114 and are sized accordingly. In an embodiment, a length and a width of islands 902 correspond to electrode surfaces 202, 204 of electrostatic transfer heads 114 that are between about 1 to 100 μm. For example, an island 902 may have length and width dimensions of 10 μm by 10 μm corresponding to an electrode surface 202 having length and width dimensions of 10 μm by 10 μm, or a length and width dimensions of 2.5 μm by 2.5 μm corresponding to an electrode surface 202 having length and width dimensions of 2.5 μm by 2.5 μm. However, these dimensions are exemplary, and other dimensions are envisioned in accordance with embodiments of the invention. As a contact surface of electrostatic transfer head 114 varies, e.g., between about 1 and 100 μm in length and/or width, dimensions of islands 902 may be varied accordingly. Islands 902 may be sized and located according to whether micro pick up array 104 includes monopolar or bipolar electrodes. Thus, in the case of a monopolar design, only a single island 902 is required over each electrostatic transfer head 114. In the embodiment shown in FIG. 9, two islands 902 are placed over an electrostatic transfer head 114, corresponding to a bipolar electrode design.

Figure 11:
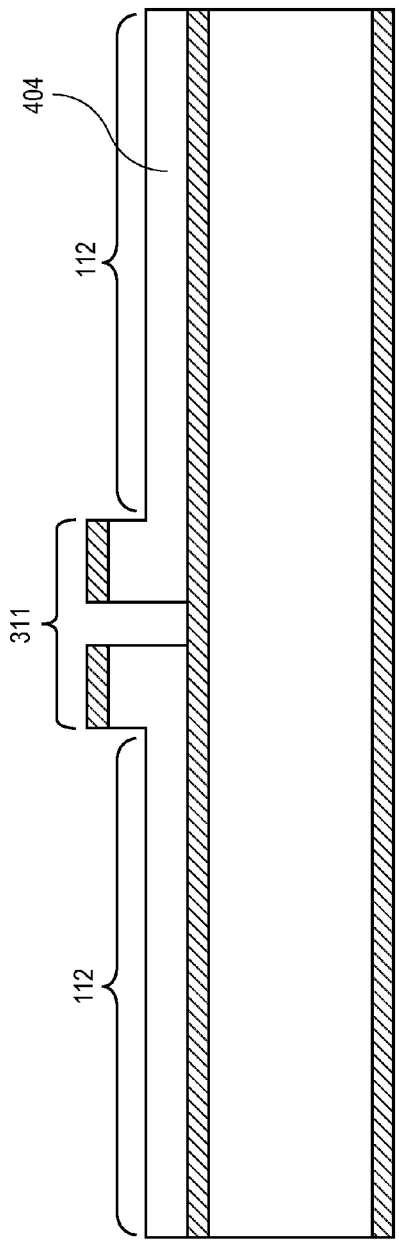

Referring to FIGS. 10-13, the mesa structures 311 and electrode interconnects 112 are patterned in a multi-part etching sequence. First, as illustrated in FIG. 10, the top silicon layer 404 between islands 902 is etched through to form trench 1002. In an embodiment, this may be accomplished using a thin patterned positive photoresist and DRIE etching through top silicon layer 404 to buried oxide layer 314. The patterned positive photoresist can be removed, resulting in the structure illustrated in FIG. 10. Second, as illustrated in FIG. 11, the top silicon layer 404 is partially etched, defining the mesa structures 311 and the electrode interconnects 112. In an embodiment, this may be accomplished with a thin patterned positive photoresist or with a thermal oxide mask followed by DRIE etching, e.g., to remove approximately 5 μm of a 7-10 μm thick top silicon layer 404 in a timed etch, resulting in the structure illustrated in FIG. 11. Thus, the thickness after etching of top silicon layer 404 defining electrode interconnects 112 may be about 5 μm in an embodiment in which approximately 5 μm of a 10 μm thick top silicon layer 404 is removed by DRIE etching. This is consistent with the 5 μm thick top silicon layer 404 within flexible membrane 310 described above. Alternatively, the thickness of top silicon layer 404 within electrode interconnects 112 may be about 3 μm in an embodiment in which approximately 5 μm of a 7 μm thick top silicon layer 404 is removed by DRIE etching. Accordingly, the thickness of top silicon layer 404 within electrode interconnects 112 may be equal to the thickness of top silicon layer 404 within flexible membrane 310. However, the thickness of top silicon layer 404 within flexible membrane 310 need not be the same as the thickness of top silicon layer 404 defining electrode interconnects 112, but may instead be thinner or thicker. After DRIE etching, a buffered oxide etch having hydrofluoric acid and a buffering agent is used to remove the islands 902 without removing a substantial thickness of the buried oxide layer 314, thereby revealing electrode surfaces 202, 204 and resulting in the structure illustrated in FIG. 12. Next, a patterned positive photoresist, e.g., having a thickness of about 12 to 15 μm, may be followed by DRIE etching of previously etched areas of electrode interconnect 112 to form electrode traces, resulting in the structure illustrated in FIG. 13.

Figure 14:
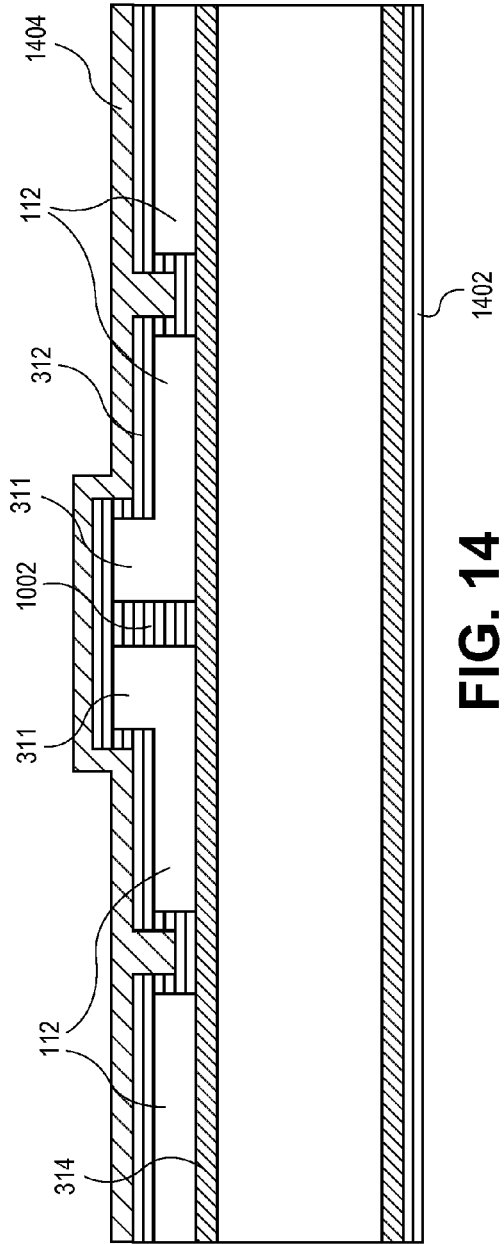

Referring to FIG. 14, a dielectric layer 312 is formed over top silicon layer 404 in order to passivate the mesa structures 311 and electrode interconnect 112 and a backside dielectric layer 1402 is formed. Atomic layer deposition, thermal oxidation, or chemical vapor deposition may be used to form a dielectric layer 312 over mesa structures 311 and electrode interconnect 112, as well as within trench 1002, and dielectric layer 1402 on the back surface of the bulk silicon substrate 704. Optionally, an insulating layer 1404 may be deposited over dielectric layer 312 using, for example, blanket atomic layer deposition. In an embodiment, insulating layer 1404 includes $Al_2O_3$. Thus, the structure illustrated in FIG. 14, having dielectric layer 312 and backside dielectric layer 1402, is reached.

Dielectric layer 312 may be formed from various materials, including $SiO_2$, $Al_2O_3$, $HfO_2$, or $SiN_x$. In accordance with embodiments of the invention the gripping pressure generated by the array of electrostatic transfer heads 114 on the array of micro devices is proportional to the dielectric constant of dielectric layer 312, and thus, the choice of dielectric material may be chosen to balance gripping pressure with manufacturability. In an embodiment, dielectric layer 312 is formed from $Al_2O_3$ having a thickness of about 5,000 angstroms and a dielectric constant of about 9.

Figure 15:
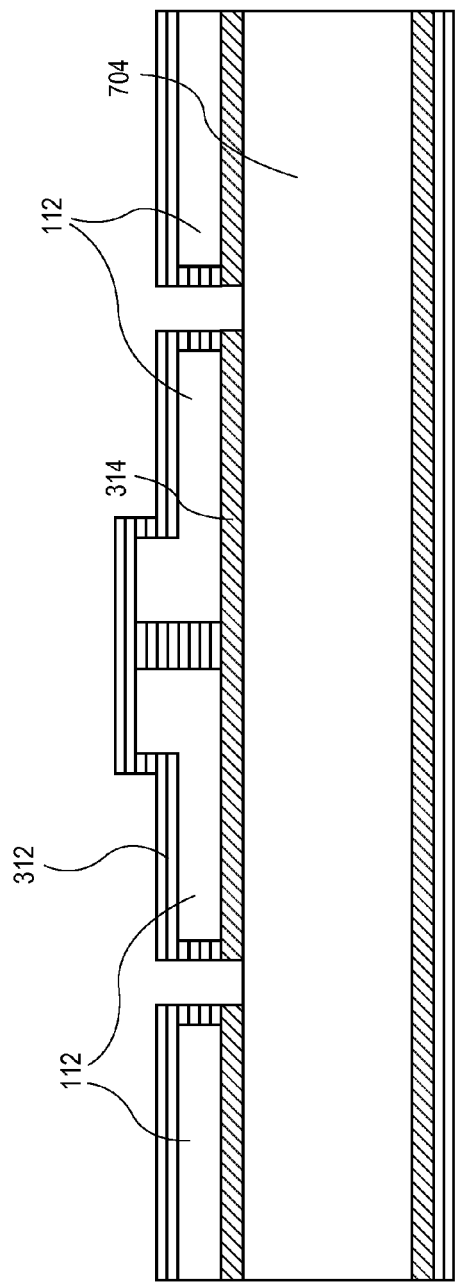

Referring to FIG. 15, a spring pre-release for forming cavity 212 is created around portions of electrode interconnect 112 in a multi-etch sequence. First, a patterned positive photoresist is applied and followed by RIE etching of dielectric layer 312 to buried oxide layer 314. Optional insulating layer 1404 is not shown in FIG. 15, but in a case where insulating layer 1404 is included, RIE etching may also be used to etch through insulating layer 1404 to dielectric layer 312. Second, RIE etching of buried oxide layer 314 to bulk silicon substrate 704 is performed, resulting in the structure illustrated in FIG. 15.

Figure 16:
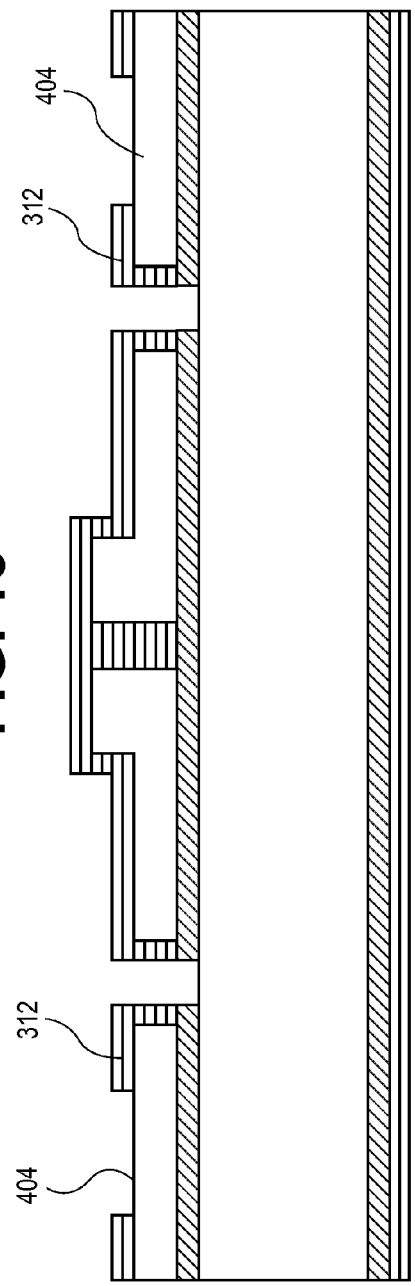
Figure 17:
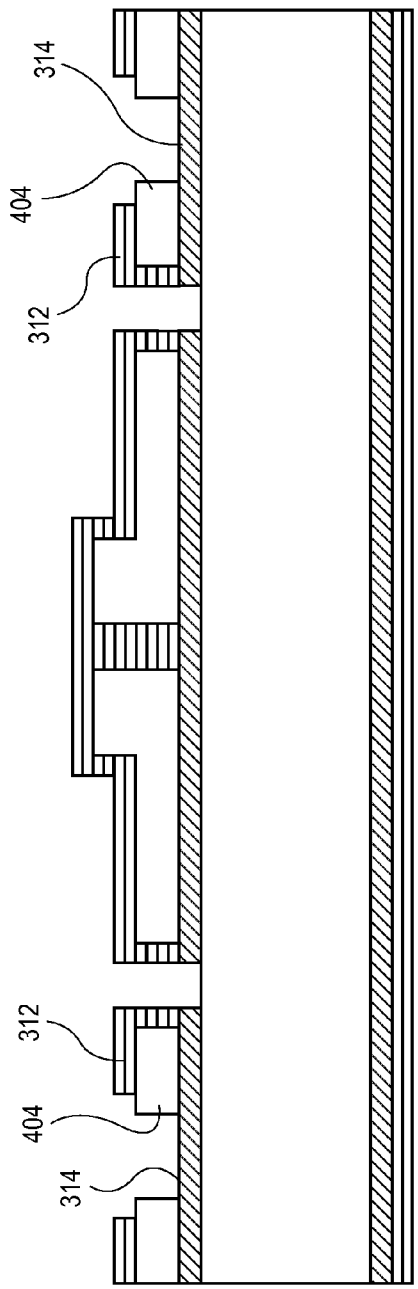
Figure 18:
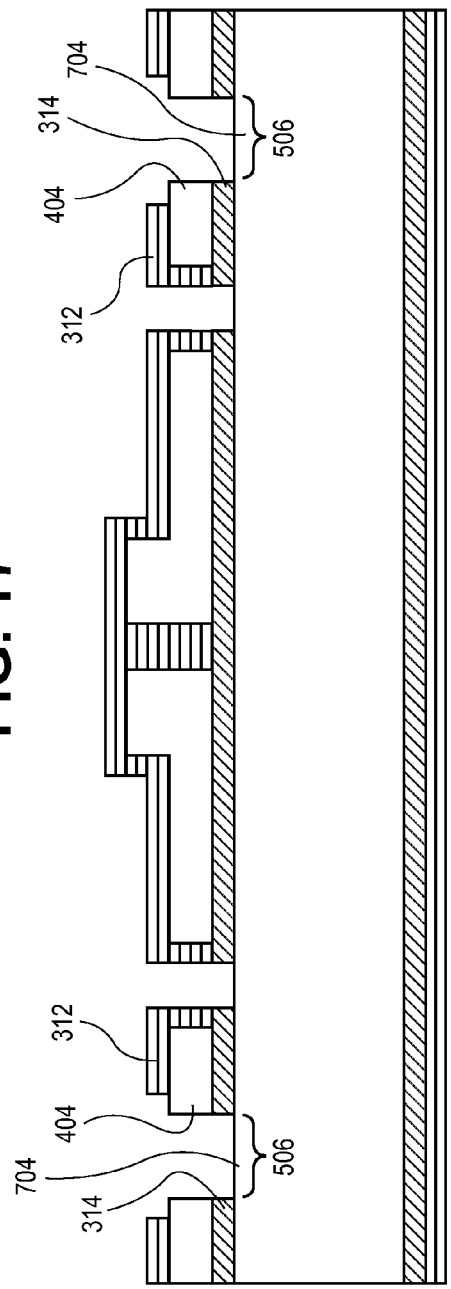

Referring to FIGS. 16-18, contact area 506 is exposed on topside plug area 504 through a multi-etch sequence. First, the previously applied patterned positive photoresist can be removed before a new patterned positive photoresist is applied and RIE etching of dielectric layer 312 to top silicon layer 404 is performed, resulting in the structure illustrated in FIG. 16. Second, the patterned positive photoresist can be removed before a second patterned positive photoresist is applied and DRIE etching of top silicon layer 404 to buried oxide layer 314 is performed, resulting in the structure illustrated in FIG. 17. Third, RIE etching of buried oxide layer 314 to bulk silicon substrate 704 is performed, resulting in the structure illustrated in FIG. 18, having contact area 506 exposed on a topside of bulk silicon substrate 704.

Figure 19:
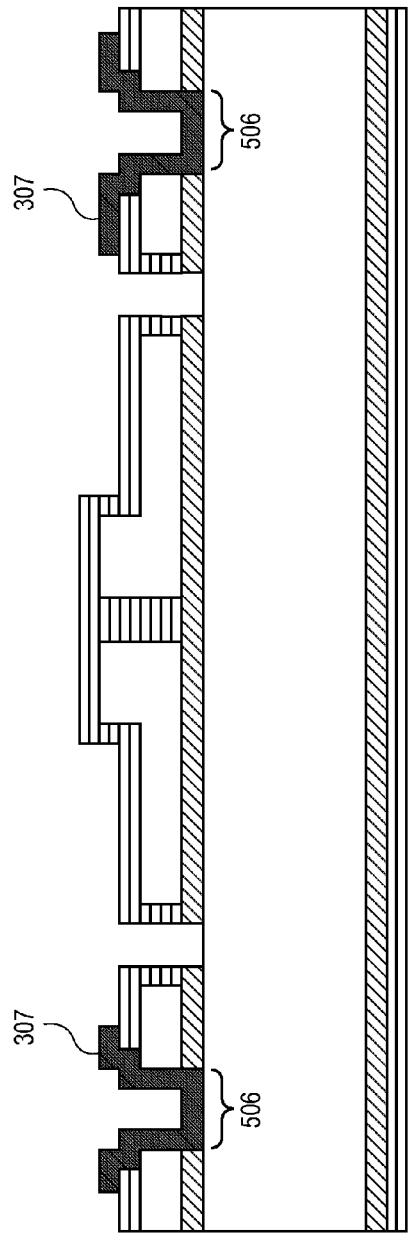

Referring to FIG. 19, topside contact 307 is formed through the opening and in electrical contact with contact area 506. The patterned positive photoresist can be removed before a patterned negative lift-off photoresist is applied and 500-1,000 angstroms TiW and 1,000-5,000 angstroms Au is sputtered to create topside contacts 307, resulting in the structure illustrated in FIG. 19.

Figure 20:
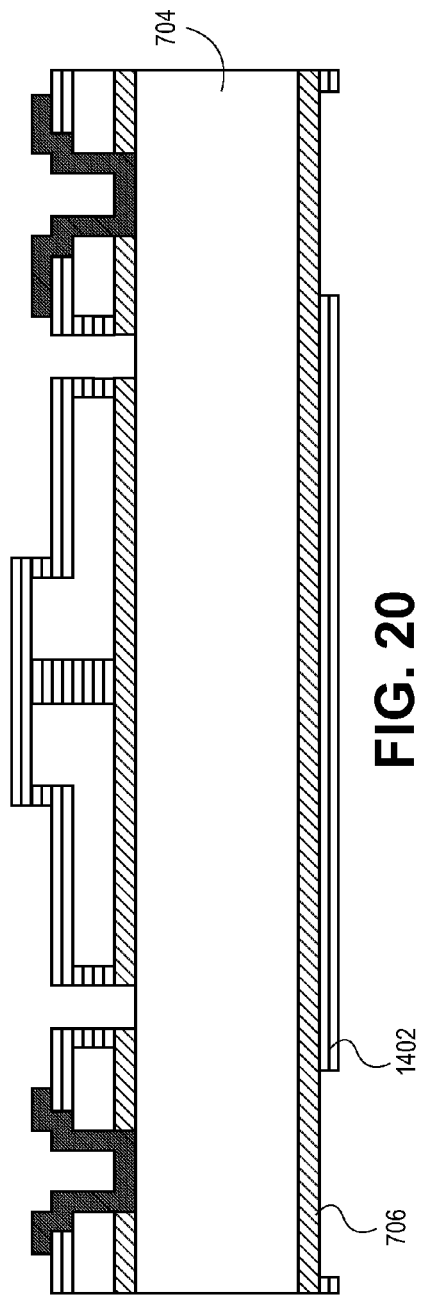

Referring to FIGS. 20-21, a backside surface of bulk silicon substrate 704 may be exposed through backside dielectric layer 1402 and backside oxide layer 706. First, a patterned positive photoresist is applied and RIE etching of backside dielectric layer 1402 to backside oxide layer 706 is performed, resulting in the structure illustrated in FIG. 20. Second, RIE etching of backside dielectric layer 1402 to bulk silicon substrate 704 is performed, resulting in the structure illustrated in FIG. 21.

Referring to FIG. 22, one or more contact pad 306 may be formed on a backside surface of bulk silicon substrate 704. About 500 to 1,000 angstroms TiW and 1,000 to 5,000 angstroms Au may be sputtered to create contact pads 306, resulting in the structure illustrated in FIG. 22.

Referring to FIG. 23, a gap 308 separating a plug 304 and a base substrate 214 of bulk silicon substrate 704 may be formed around contact pads 306. A patterned positive photoresist is applied and DRIE etching of bulk silicon substrate 704 to buried oxide layer 314 is performed, resulting in the structure illustrated in FIG. 23. The arrangement of plug 304 and base substrate 214 is described above. Plug 304 and base substrate 214 may be considered as portions of bulk silicon substrate 704 that are defined during the formation of micro pick up array 104 and therefore become individual features of micro pick up array 104.

Referring to FIG. 24, one or more cavities 212 may optionally be etched in bulk silicon substrate 704 underneath the array of electrostatic transfer heads 114 such that the array of electrostatic transfers heads are deflectable into the one or more cavities 212. In an embodiment, a separate cavity 212 is formed underneath each electrostatic transfer head 114. In an embodiment, a single cavity 212 is formed underneath the array of silicon electrodes in electrical communication with the electrode interconnects 112. In an embodiment, cavity 212 is formed with a timed release etch into the bulk silicon substrate 704 and undercuts the electrode interconnect 112 and mesa structures. For example, etching may be performed with a fluorine based chemistry such as $XeF_2$ or $SF_6$. During etching, the backside of SOI stack 702 may be protected with dicing tape.

Following the optional formation of the one or more cavities 212, the SOI substrate may be diced, for example using laser dicing, to form one or more micro pick up arrays 104 having compliant contacts interconnected with electrostatic transfer heads 114 through electrode interconnects 112. Furthermore, the micro pick up array 104 may include one or more contact pads 306 that electrically connect electrostatic transfer heads 114 with working circuitry or voltage sources 106, 206 of transfer head assembly 102.

Referring again to FIG. 25, the system having micro pick up array 104 physically and electrically coupled with transfer head assembly 102 may be positioned over an array of micro devices 2510 on a carrier substrate 2508. More specifically, the system may be moved relative to both carrier substrate 2508 and a receiving substrate while supplying an electrostatic voltage to electrostatic transfer heads 114 as needed in order to grip, transfer, and release micro devices 2510 from carrier substrate 2508 to the receiving substrate. As an example, the receiving substrate may be, but is not limited to, a display substrate, a lighting substrate, a substrate with functional devices such as transistors or ICs, or a substrate with metal redistribution lines. During movement between carrier substrate 2508 and the receiving substrate, the array of micro devices 2510 may be retained by the array of electrostatic transfer heads 114 using a persistent electrostatic gripping pressure maintained by a transfer of voltage to electrostatic transfer heads 114. Alternatively, voltage application may be discontinued during movement between carrier substrate 2508 and the receiving substrate, and the array of micro devices 2510 may still be retained against the array of electrostatic transfer heads 114 by non-electrostatic forces, such as van der Waals forces. The array of micro devices 2510 may be released onto receiving substrate following transfer from carrier substrate 2508, for example, by discontinuing the voltage supply to electrostatic transfer heads 114.

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A micro pick up array comprising:
a base substrate having a via;
a membrane over the via;
a plug within the via and supported by the membrane, wherein a gap separates the plug from the base substrate; and
an array of electrostatic transfer heads electrically coupled with the plug.

2. The micro pick up array of claim 1, wherein each electrostatic transfer head comprises: a mesa structure having an electrode surface, and a dielectric layer covering the electrode surface.

3. The micro pick up array of claim 2, further comprising an electrode interconnect electrically coupling the electrode surface with the plug.

4. The micro pick up array of claim 3, wherein a topside contact on the plug electrically couples the electrode interconnect with the plug.

5. The micro pick up array of claim 4, wherein the topside contact contacts the plug over a contact area, wherein the contact area is coplanar with a topside plug area, and wherein the contact area is less than two-thirds of the topside plug area.

6. The micro pick up array of claim 4, further comprising a contact pad on the plug opposite the topside contact, wherein the contact pad is electrically coupled with the topside contact through the plug.

7. The micro pick up array of claim 6, wherein an electrical resistance across the plug between the contact pad and the topside contact is in a range between 1 and 100 kiloohms.

8. The micro pick up array of claim 3, wherein each electrostatic transfer head further comprises a second electrode surface adjacent the electrode surface, wherein the dielectric layer covers the second electrode surface, and wherein a second electrode interconnect electrically couples the second electrode surface with a second plug.

9. The micro pick up array of claim 1, wherein each electrostatic transfer head is deflectable into a cavity in the base substrate.

10. The micro pick up array of claim 1, wherein the membrane comprises a silicon layer.

11. The micro pick up array of claim 1, wherein the membrane is a flexible membrane and the plug is movable relative to the base substrate.

12. The micro pick up array of claim 1, wherein the plug includes an axis orthogonal to the membrane, and wherein the membrane is configured to deflect such that the plug is moveable not more than 5 μm along the axis relative to the base substrate.

13. The micro pick up array of claim 1, wherein the gap is filled with a dielectric material.

* * * * *